US010923790B2

(12) United States Patent
Xue et al.

(10) Patent No.: US 10,923,790 B2
(45) Date of Patent: Feb. 16, 2021

(54) LOW-LOSS SILICON ON INSULATOR BASED DIELECTRIC MICROSTRIP LINE

(71) Applicant: City University of Hong Kong, Kowloon (HK)

(72) Inventors: Quan Xue, Kowloon (HK); Hao-Tian Zhu, Kowloon (HK)

(73) Assignee: City University of Hong Kong, Kowloon (HK)

(*) Notice: Subject to any disclaimer, the term of this patent is extended or adjusted under 35 U.S.C. 154(b) by 330 days.

(21) Appl. No.: 15/437,133

(22) Filed: Feb. 20, 2017

(65) Prior Publication Data

US 2018/0241128 A1 Aug. 23, 2018

(51) Int. Cl.
*H01L 23/66* (2006.01)
*H01P 3/16* (2006.01)
*H01P 1/02* (2006.01)
*H01P 11/00* (2006.01)
*H01P 5/08* (2006.01)
*H01P 5/19* (2006.01)
(Continued)

(52) U.S. Cl.
CPC .............. *H01P 1/027* (2013.01); *H01L 23/66* (2013.01); *H01P 3/16* (2013.01); *H01P 5/087* (2013.01); *H01P 5/19* (2013.01); *H01P 11/006* (2013.01); *H01L 21/84* (2013.01); *H01L 27/1203* (2013.01); *H01L 2223/6627* (2013.01); *H01L 2223/6677* (2013.01); *H01Q 13/02* (2013.01)

(58) Field of Classification Search
CPC .......... H01P 1/027; H01L 23/66; H01L 21/84; H01L 27/1203; H01L 2223/6627; H01L 2223/6677; H01Q 13/02

USPC ........................................................ 438/719
See application file for complete search history.

(56) References Cited

U.S. PATENT DOCUMENTS

| 2010/0108891 | A1* | 5/2010 | Cox | ................... | G01N 21/3581 250/341.8 |
| 2010/0245155 | A1* | 9/2010 | Miyazato | ................ | H01P 3/081 342/104 |
| 2014/0357051 | A1* | 12/2014 | Li | ..................... | H01L 21/76275 438/458 |

OTHER PUBLICATIONS

W. L. Shan et al., "Development of Superconducting Spectroscopic Array Receiver: A Multibeam 2SB SIS Receiver for Millimeter-Wave Radio Astronomy," IEEE Trans. THz Sci. Technol., vol. 2, No. 6, pp. 593-604, Nov. 2012.

(Continued)

*Primary Examiner* — Didarul A Mazumder
(74) *Attorney, Agent, or Firm* — Norton Rose Fulbright US LLP

(57) ABSTRACT

Systems and methods which provide low-loss dielectric microstrip line (DML) circuits for use with respect to signals in the terahertz frequency range are described. Low-loss DML integrated circuits of embodiments, such as may comprise DML transmission lines, DML couplers, DML crossovers, etc., may be based on silicon technology and are adapted for signal frequencies in the range of 750-925 GHz. A DML circuit implementation may be comprised of silicon on insulator based DML structure having a silicon dioxide ($SiO_2$) insulation layer as the middle layer of the DML, wherein the device layer (HR—Si) and the handle layer (HR—Si) are the top and bottom layers of the DML. A high-precision fabrication process for the SOI wafer, wherein the height of the dielectric microstrip lines can be accurately controlled, may be utilized to fabricate DML (Continued)

circuits of embodiments. A non-contact measurement technology may be used to test the DML circuits of embodiments.

17 Claims, 18 Drawing Sheets

(51) Int. Cl.
    *H01Q 13/02*     (2006.01)
    *H01L 27/12*     (2006.01)
    *H01L 21/84*     (2006.01)

(56) References Cited

OTHER PUBLICATIONS

T. Reck et al., "A Silicon Micromachined Eight-Pixel Transceiver Array for Submillimeter-Wave Radar," IEEE Trans. THz Sci. Technol., vol. 5, No. 2, pp. 197-206, Mar. 2015.

J. Y. Suen, et al., "Modeling of Terabit Geostatinary Terahertz Satellite Links From Globally Dry Locations," IEEE Trans. THz Sci. Technol. vol. 5, No. 2, pp. 299-313, Mar. 2015.

B. J. Drouin et al., "Characterization and Use of a 1.3-1.5 THz Multiplier Chain for Modlecular Spectroscopy," IEEE Trans. THz Sci. Technol., vol. 3, No. 3, pp. 314-321, Mar. 2013.

G. N. Kulipanov et al., "Novosibirsk Free Electron Laser—Facility Description and Recent Experiments," IEEE Trans. THz Sci. Technol., vol. 5, No. 5, pp. 798-809, Sep. 2015.

K. M. K. H. Leong et al., "WR1.5 Silicon Micromachined Waveguide Components and Active Circuit Integration Methodology," IEEE Trans. Microw. Theory Techn., vol. 60, No. 4, pp. 998-1005, Apr. 2012.

Waveguide Band Designations, Virginia Diodes, Inc., Charlottesville, VA., USA. (2014). [Online]. Available: http://vadiodes.com/images/AppNotes/Waveguide_Band_Designations_Table_updated_01_2014.pdf.

W. Deal et al., "THz Monolithic Integrated Circuits Using InP High Electron Mobility Transistors," IEEE Trans. THz Sci. Technol., vol. 1, No. 1, pp. 25-32. Sep. 2011.

A. Patrovsky et al., "Substrate Integrated Image Guide (SIIG)—A Planar Dielectric Waveguide Technology for Millimeter-Wave Applications," IEEE Trans. Microw. Theory Techn., vol. 54, No. 6, pp. 2872-2879, Jun. 2006.

A. Patrovsky et al., "Substrate Integrated Image Guide (SIIG)—A Low-Loss Waveguide for Millimetre-Wave Applications," in Proc. 35th Eur. Microw. Conf., Paris, France, Oct. 2005, pp. 897-900.

A. Malekabadi et al., "High-Resistivity Silicon Dielectric Ribbon Waveguide for Single-Mode Low-Loss Propagation at F/G-Bands," IEEE Trans. THz Sci. Technol., vol. 4, No. 4, Jul. 2014, pp. 447-453.

N. Ranjkesh et al., "Silicon-On-Glass Dielectric Waveguide-Part II: For THz Applications," IEEE Trans. THz Sci. Technol., vol. 5, No. 2, pp. 280-287, Mar. 2015.

Q. Xue et al., "A Transition of Microstrip Line to Dielectric Microstrip Line for Millimeter Wave Circuits," in Proc. IEEE Int. Wireless Symp., Beijing, China, Apr. 2013, pp. 1-4.

H. T. Zhu et al., "Low Loss Dielectric Ridge Waveguide Based on High Resistivity Silicon for $E_{11}^y$ Mode Propagation at 750-1000GHz," in IEEE MTT-S Int. Microw. Symp. Dig., Phoenix, AZ., USA, May 2015, pp. 1-4.

N. Ranjkesh "Si Waveguide Technology for High Performance Millimeter-Wave/Terahertz Integrated Systems," Ph.D. Dissertation, Dept. Electr. Comput. Eng., Univ. Waterloo, Waterloo, ON, Canada, 2015, 206 pages.

H. T. Zhu et al., "A THz Measurement Platform Design for 0.2-1.1 THz," in Proc. 40th Int. Conf. Infrared, Millimeter THz Waves, Hong Kong, Aug. 2015, pp. 1-2.

\* cited by examiner

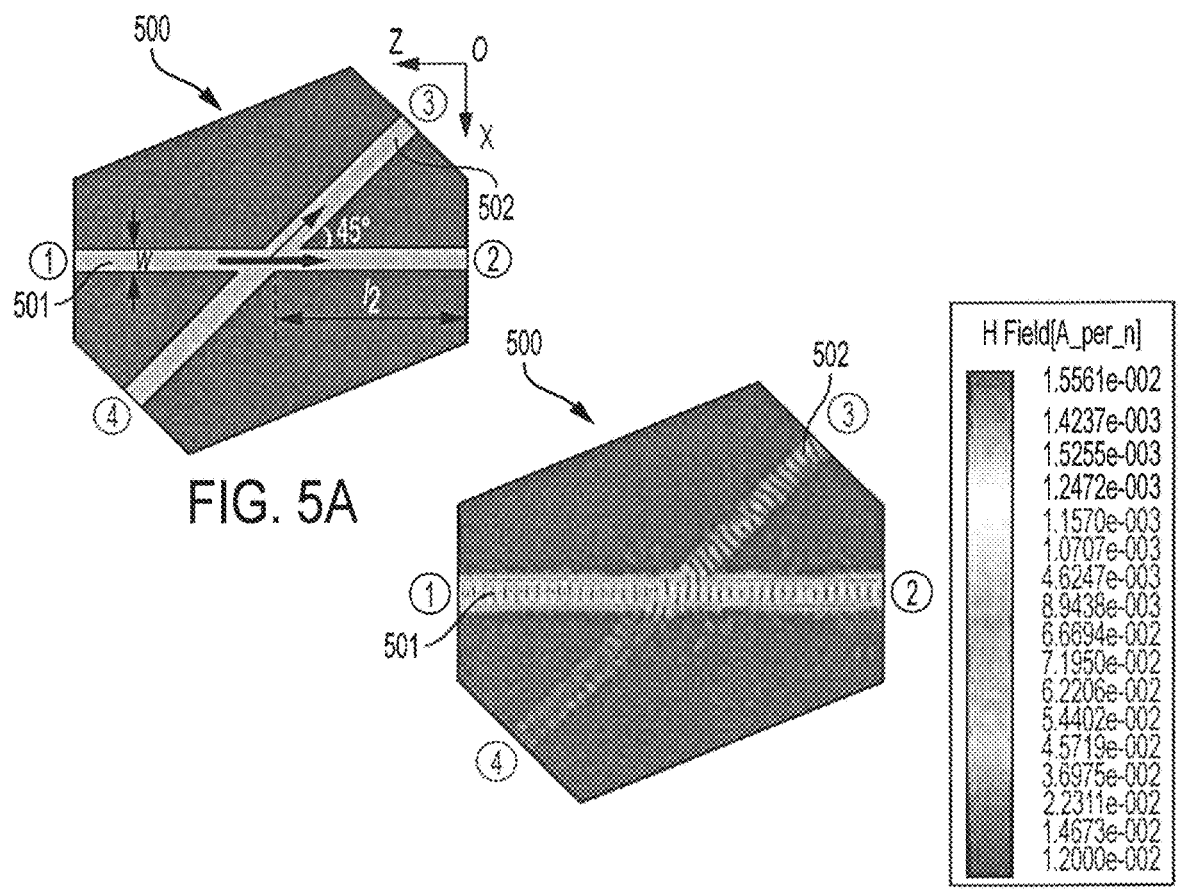
FIG. 5A
FIG. 5B
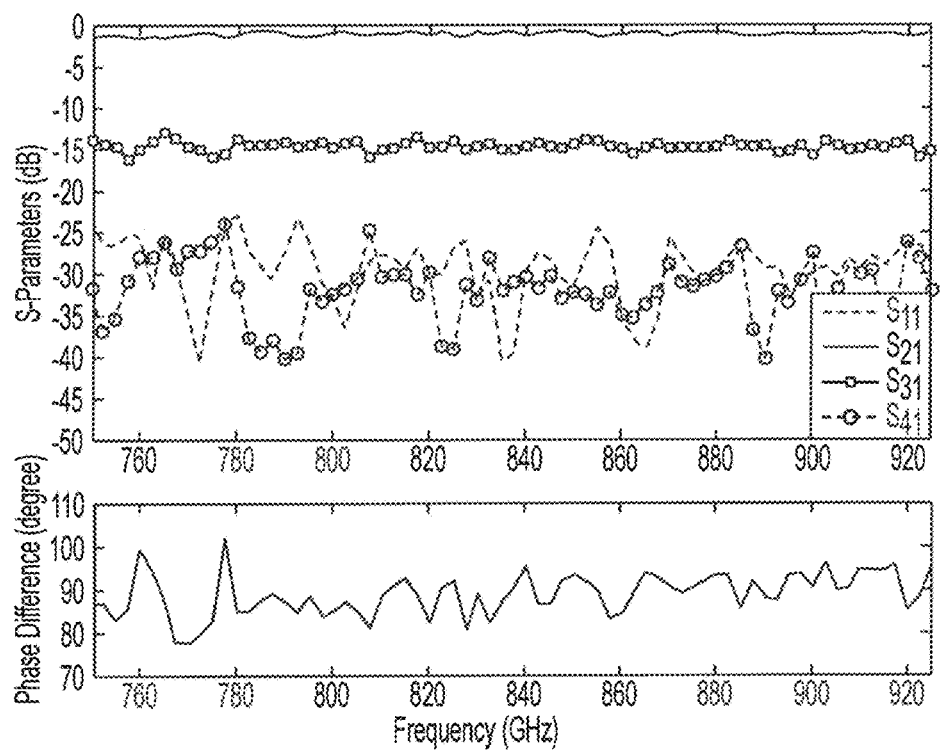
FIG. 5C

LOW-LOSS SILICON ON INSULATOR BASED DIELECTRIC MICROSTRIP LINE

TECHNICAL FIELD

The invention relates generally to circuits for use with respect to high frequency signals and, more particularly, to low-loss silicon on insulator (SOI) based dielectric microstrip line (DML) circuits for signals in the terahertz frequency range.

BACKGROUND OF THE INVENTION

Various circuitry for enabling communication of relatively high frequency signals has been utilized for a number of years. For a number of reasons, such as the availability of relatively unused spectrum, radiation providing penetration of a wide variety of materials, etc., the use of signals at higher frequencies such as in the terahertz (THz) range are being explored. Terahertz circuits may, for example, be applied in various fields such as security imaging, high-speed communication, deep space exploration, and molecular spectroscopy (see B. J. Drouin, J. C. Pearson, S. S. Yu, and H. Gupta, "Characterization and use of a 1.3-1.5 THz multiplier chain for molecular spectroscopy," *IEEE Trans. THz Technol.*, vol. 3, no. 3, pp. 314-321, March 2013; K. M. K. H. Leong, K. Henning, C. Zhang, R. N. Elinadjian, Z. Zhou, B. S. Gorospe, P. P. C. Chien, C. Radisic, W. R. Deal, "WR1.5 silicon micromachined waveguide components and active circuit integration methodology," *IEEE Trans. Microw. Theory Tech.*, vol. 60, no. 4, pp. 2872-2879, April 2012; A. Patrovsky, and K. Wu, "Substrate integrated image Guide (SIIG)—A planar dielectric waveguide technology for millimeter-wave applications," *IEEE Trans. Microw. Theory Tech.*, vol. 54, no. 6, pp. 2872-2879, June 2006; A. Patrovsky, and K. Wu, "Substrate integrated image Guide (SHG)—A low-loss waveguide for millimeter-wave applications," in *Proc. 35th Eur. Microw. Conf.*, Pairs, France, October 2005, pp. 897-900; and A. Malekahadi, S. A. Charlehois, D. Deslandes and F. Boone, "High-resistivity silicon dielectric ribbon waveguide for single-mode low-loss propagation at F/G-bands," *IEEE Trans, THz Sci. Technol.*, vol. 4, no. 4, pp. 447-453, July 2014, the disclosures of which are incorporated herein by reference).

Transmission lines are an essential element of most THz circuits. The requirements for THz transmission lines are generally low loss, low cost, planar structure, easy fabrication, and high level of integration with other devices. However, it has proved to be challenging to implement THz transmission lines meeting these general requirements with current technology. That is, traditional transmission lines cannot easily meet all of the foregoing requirements for suitable THz transmission lines such as may be utilized in implementing various THz circuits.

The rectangular waveguide, for example, is the transmission line dominantly implemented in THz circuits today. However, high accuracy is required for the machining fabrication process to produce suitable rectangular waveguide structures. In particular, rectangular waveguides are not easily fabricated and are relatively high-cost because of their three-dimensional (3-D) structure and high alignment precision requirement (see Navy Ranjkesh, Mohamed Basha, Aidin Taeb, and Safieddin Safavi-Naeini, "Silicon-on-glass dielectric waveguide—part II: for THz applications," *IEEE Trans. THz Sci, Technol.*, vol. 5, no. 2, pp. 280-287, March 2015 and Q. Xue, L. Chiu, H. T. Zhu, "A transition of microstrip line to dielectric microstrip line for millimeter wave circuits," in *Proc. IWS 2013 IEEE Int.*, Beijing China., April 2013, pp. 1-4, the disclosures of which are hereby incorporated herein by reference).

The microstrip lines and coplanar waveguides are also not well suited for THz applications. In particular, each of these transmission line technologies have large attenuations caused by conductor loss associated therewith. (see W. Deal, X. B. Mei, K. Leong, S. Sarkozy, and R. Lai, "THz monolithic integrated circuits using InP high electron mobility transistors," *IEEE Trans. THz Technol.*, vol. 1, no. 1, pp. 25-32, September 2011, the disclosure of which is hereby incorporated herein by reference).

Dielectric transmission lines provide a transmission line technology having desirable characteristics. For example, dielectric transmission lines provide transmission line implementations having low conductor loss (see N. Ranjkesh, "Si waveguide technology for high performance millimeter-waveterahertz integrated systems," Ph.D. dissertation, Dept. Electrical and Computer Engineering, University of Waterloo, Waterloo, Ontario, Canada, 2015; A. Patrovsky and K. Wu, "Substrate integrated image Guide (SIIG)-A low-loss waveguide for millimeter-wave applications," in *Proc. 35th Eur. Microw. Conf.*, Paris, France, October 2005, pp. 897-900; A. Malekabadi, S. A. Charlebois, D. Deslandes, and F. Boone, "High-resistivity silicon dielectric ribbon waveguide for single-mode low-loss propagation at F/G-bands," *IEEE Trans. THz Sci. Technol.*, vol. 4, no. 4, pp. 447-453, July 2014; N. Ranikesh, M. Basha, A. Taeb, and S. Safavi-Naeini, "Silicon-on-glass dielectric waveguide-Part For THz applications," *IEEE Trans. THz Sci. Technol.*, vol. 5, no. 2, pp. 280-287, March 2015; Q. Xue, L. Chiu, and H. T. Zhu, "A transition of microstrip line to dielectric microstrip line for millimeter wave circuits," in *Proc. IEEE Int. Wireless Symp.*, Beijing, China., April 2013, pp. 1-4; and H. T. Zhu, Q. Xue, S. W. Pang, J. N. Hui, and X. H. Zhao, "Low loss dielectric ridge waveguide based on high resistivity silicon for Ey11 mode propagation at 750-1000 GHz," in *IEEE MTT-S Int. Microw. Symp. Dig.*, Phoenix, Ariz., USA, May 2015, pp. 17-22, the disclosures of which are hereby incorporated herein by reference).

A substrate integrated image guide (SIIG) dielectric transmission line implementation may, for example, provide relatively low conductor loss. A measured attenuation value of 0.07 dB/$\lambda$ at 94 GHz was reported with respect to a SIIG transmission line configuration in which the SIIG was surrounded by lower effective permittivity regions and laser-cutting technology was used to fabricate the SIIG (see A. Patrovsky, and K. Wu, "Substrate integrated image Guide (SIIG)—A planar dielectric waveguide technology for millimeter-wave applications," *IEEE Trans. Microw. Theory Tech.*, vol. 54, no. 6, pp. 2872-2879, June 2006). However, limited by the precision of the fabrication technology, the foregoing SIIG transmission line configuration is only suitable for millimeter-wave applications and is not suitable for THz applications.

An inductively coupled plasma deep reactive ion etching (DRIE) dielectric transmission line implementation is another configuration of a dielectric transmission line that provides relatively low conductor loss. For example, DRIE technology has been used to fabricate two high-resistivity silicon (HR≥Si) dielectric ribbon waveguides for 90-140 GHz and 140-220 GHz (see A. Malekabadi, S. A. Charlebois, D. Deslandes, and F. Boone, "High-resistivity silicon dielectric ribbon waveguide for single-mode low-loss propagation at F/G-bands," *IEEE Trans. THz Sci. Technol.*, vol. 4, no. 4, pp. 447-453, July 2014). As another example, a silicon-on-glass (SOG) dielectric waveguide has been fabricated using photolithography and DRIE technology and was tested over the frequency range of 440-500 GHz (see N. Ranjkesh, M. Basha, A. Taeb, and S. Safavi-Naeini, "Silicon-on-glass dielectric waveguide-Part II: For THz applications," *IEEE Trans. THz Sci. Technol.*, vol. 5, no. 2, pp. 280-287, March 2015). The measured attenuation constant of the foregoing dielectric waveguide was 0.0346 dB/λ (average value). However, the studies for such DRIE implementations have been focused on frequencies below 750 GHz and have generally not been studied for frequencies in the range of 750 GHz-3 THz (see T. Reck, C. Jung-Kubiak, J. Gill, and G. Chattopadhyay, "Measurement of silicon micromachined waveguide components at 500 to 750 GHz," *IEEE Trans. THz Sci. Technol.*, vol. 4, no. 1, pp. 33-38, January 2014 and C. Jung-Kubiak, T. Reck, J. V. Siles, R. Lin, C. Lee, J. Gill, K. Cooper, I. Mehdi, and G. Chattopadhyay, "A multistep DRIE process for complex terahertz waveguide components," *IEEE Trans. THz Sci. Technol.*, vol. 6, no. 5, pp. 690-695, September 2016, the disclosures of which are hereby incorporated herein by reference). Instead of studying DRIE implementations for use with respect to THz frequencies, traditional research has been based on the above mentioned rectangular metallic waveguide technology.

BRIEF SUMMARY OF THE INVENTION

The present invention is directed to systems and methods which provide low-loss dielectric microstrip line (DML) circuits for use with respect to signals in the terahertz frequency range. Low-loss DML integrated circuits of embodiments of the invention are, for example, based on silicon (Si) technology and are adapted for signal frequencies in the range of 750-925 GHz. DML circuits of embodiments may, for example, comprise various passive circuit component configurations, such as DML transmission lines, DML couplers, DML crossovers, rectangular dielectric waveguides dielectric ridge waveguides, etc., wherein the passive circuit components based on DML implementations according to concepts of the present disclosure have good performance and very simple structures.

In operation of a DML circuit, the electromagnetic (EM) wave is confined in the central lower dielectric layer, bounded by two higher dielectric layers (see Q. Xue, L. Chin, and H. T. Zhu, "A transition of microstrip line to dielectric microstrip line for millimeter wave circuits," in *Proc. IEEE Int. Wireless Symp.*, Beijing, China., April 2013, pp. 1-4). Embodiments of a DML circuit implementation herein are comprised of a silicon on insulator (SOI) wafer adapted to provide a SOI based DML implementations for signals in the range of 750-925 GHz. SOI based DML circuits of embodiments comprise a silicon dioxide (SiO$_2$) insulation layer as the middle layer of the DML, wherein a HR—Si device layer (e.g., a layer on the insulator base in which device circuits are defined) and a HR—Si handle layer (e.g., a layer providing a robust carrier for easily handling and processing the thinner device layer) are the top and bottom layers of the DML, respectively. In operation of SOI based DML circuits of embodiments the energy is concentrated in the SiG$_2$ layer, in contrast to the operation of a HR—Si-based dielectric ridge waveguide (see H. T. Zhu, Q. Xue, S. W. Pang, J, N. Hui, and X. H. Zhao, "Low loss dielectric ridge waveguide based on high resistivity silicon for E$^y_{11}$ mode propagation at 750-1000 GHz," in *IEEE MTT-S Int. Microw. Symp. Dig.*, Phoenix, Ariz., USA, May 2015, pp. 17-22).

DML implementations utilized according to embodiments of the invention have no periodic supporting beams and thus have no Bragg effect (see A. Patrovsky and K. Wu, "Substrate integrated image Guide (SHG)-A low-loss waveguide for millimeter-wave applications," in *Proc. 35th Eur. Microw. Conf.*, Paris, France, October 2005, pp. 897-900), in contrast to E$^x_{11}$ mode Si-based SOG dielectric waveguide implementations (see N. Ranjkesh, M. Bashak. Taeb, and S. Safavi-Naeini, "Silicon-on-glass dielectric waveguide-Part II: For THz applications," *IEEE Trans. THz Sci. Technol.*, vol. 5, no. 2, pp. 280-287, March 2015). Moreover, the E$^y_{11}$ mode of a DML circuit according to the concepts herein can be transferred to a microstrip line or coplanar waveguide more easily than the E$^x_{11}$ mode in a planar structure. Therefore, DML circuits of embodiments can be easily connected to active devices with simple microstrip line leads (see Q. Xue, L. Chiu, and H. T. Zhu, "A transition of microstrip line to dielectric microstrip line for millimeter wave circuits," in *Proc. IEEE Int.* Wireless Symp., Beijing, China, April 2013, pp. 1-4).

A high-precision fabrication process for the SOI wafer may be utilized to fabricate DML circuits of embodiments of the invention, in the fabrication process implemented according to embodiments, the SiO$_2$ layer can stop the DRIE process, used in fabricating a dielectric ribbon of the DML circuits, due to the etch selectivity between Si and SiO$_2$. Accordingly, the height of the dielectric microstrip lines can be accurately controlled according to embodiments.

Embodiments of the invention provide a non-contact measurement technology used to test DML circuits fabricated in accordance with the concepts herein. For example, a non-contact measurement implementation of embodiments utilize a horn antenna configuration in combination with a bend based on the DML to avoid direct transmission between horn antennas of the measurement system. Utilizing implementations of a non-contact measurement system of embodiments, the measured loss per wavelength of DML ranges from 0.0082 to 0.042 dBλ over 750-925 GHz. The measured isolation of the crossover provided by an exemplary DML crossover circuit implemented according to the concepts herein is 25.45±5.54 dB, and the measured coupler factor of an exemplary DML coupler circuit implemented according to the concepts herein is −13.22±3.23 dB.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which:

FIG. 5A shows a top view of a coupler circuit implemented using DML structures of embodiments of the invention.

FIG. 5B shows the Horfield distribution in the $SiO_2$ layer of a DML coupler circuit of embodiments of the invention.

FIG. 5C shows simulated results of coupling operation of a DML coupler circuit of embodiments of the invention.

DETAILED DESCRIPTION OF THE INVENTION

Characterization of DML

Low-loss dielectric microstrip line (DML) circuits based on silicon (Si) technology for use with respect to terahertz (THz) frequencies (e.g., operable with respect to frequencies in the 750-925 GHz range) are provided according to embodiments of the present invention. A DML circuit implementation of embodiments is comprised of a silicon on insulator (SOI) wafer configuration, such as may comprise a silicon dioxide ($SiO_2$) insulation layer as the middle layer and high-resistivity silicon (HR—Si) layers provide the top layer (e.g., comprised of the HR—Si device layer) and the bottom layer (e.g., comprised of the HR—Si handle layer).

Figure 1A:
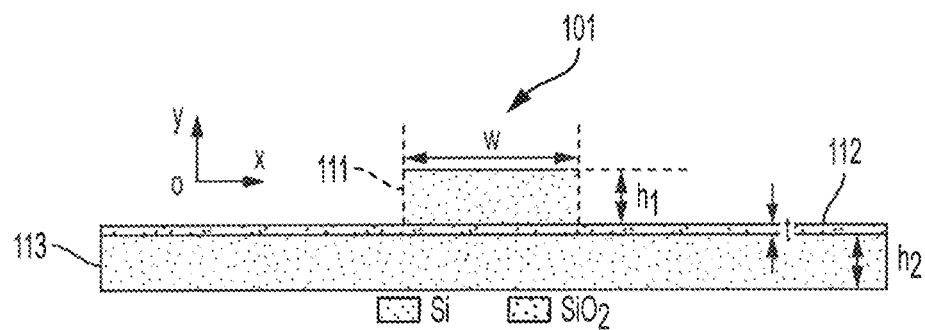
FIG. 1A shows a cross-sectional view of a DML structure as may be utilized according to embodiments of the invention.

A cross-sectional view (not to scale) of a DML structure (DML structure 101) as may be utilized by DML circuits of embodiments of the invention is shown in FIG. 1A. Layers 111 and 113 of FIG. 1A may, for example, comprise HR—Si (e.g., HR—Si, such as may have a resistivity ($\rho$)≥800 Ω·cm, wherein the relative dielectric constant is 11.9) and layer 112 may, for example, comprise $SiO_2$ (e.g., $SiO_2$ wherein the relative dielectric constant is 4). It should be appreciated that in the exemplary DML structure of FIG. 1A w represents the width of the DML microstrip, k represents the height of the DML circuit upper layer (layer 111), $h_2$ represent the height of the DML circuit lower layer (layer 113), and t represents the thickness of the middle, dielectric layer (layer 112).

Figure 1B:
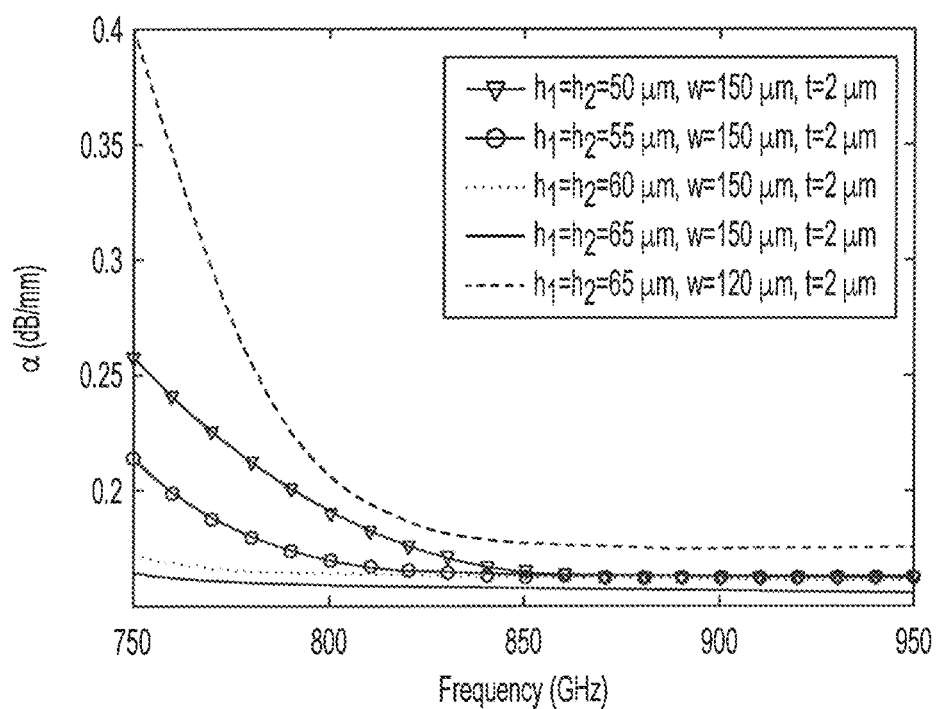
FIG. 1B shows the attenuation constant of the $E^y_{11}$ mode of a DML structure as may be utilized according to embodiments of the invention.
Figure 1C:
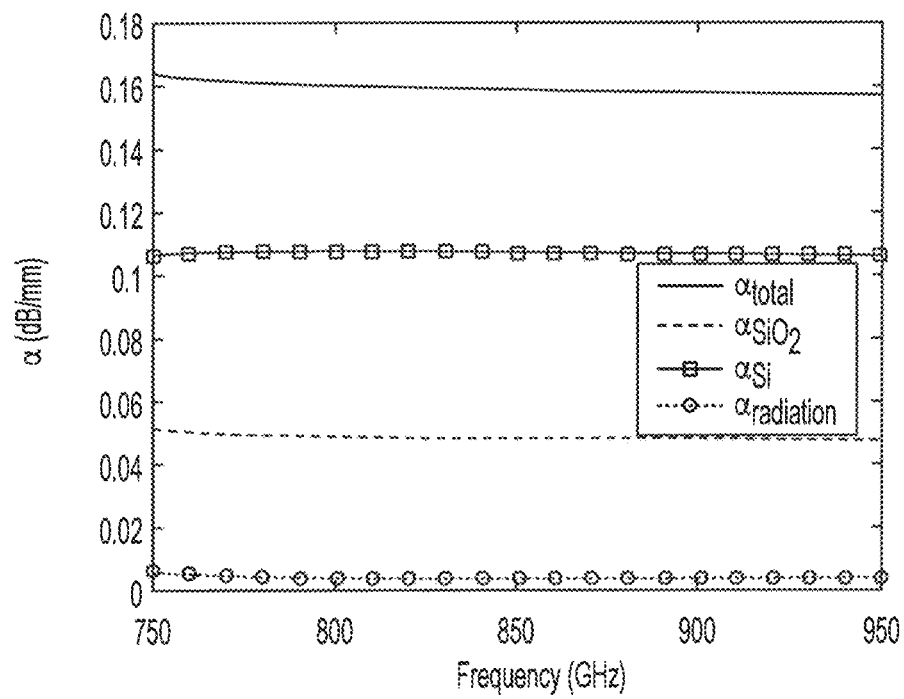
FIG. 1C shows the simulated loss contributions of a DML fabricated according to embodiments of the invention.
Figure 1D:
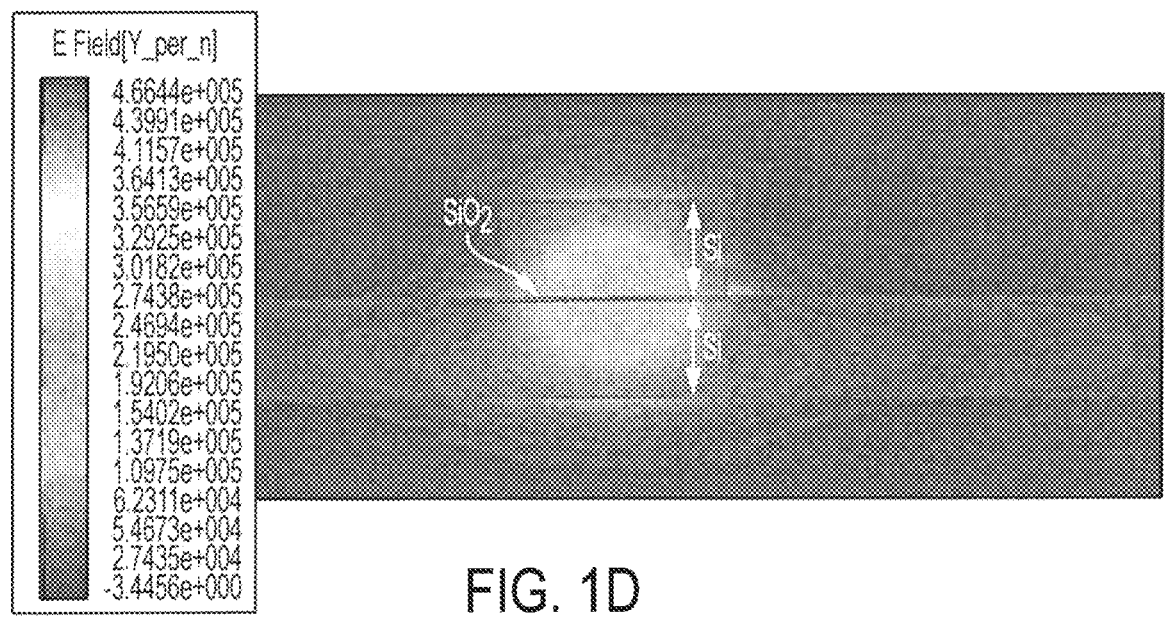
FIG. 1D shows the complex magnitude E-field distribution ($E^y_{11}$ mode) of a DML structure as may be utilized according to embodiments of the invention.

In configuring a DML circuit adapted for use with respect to THz frequencies according to embodiments of the invention, the parameters w (DML structure width), $h_1$ (DML structure top layer height), and $h_2$ (DML structure bottom layer height) are selected to achieve the smallest attenuation constant of DML. The results, as simulated by HESS 14.0 with driven modal, provided by various values of the foregoing parameters for a DML structure having a dielectric layer thickness (t) of 2 µm are shown in FIG. 1B. In particular, FIG. 1B shows the attenuation constant of the $E^y_{11}$ mode. As can be appreciated from the graph of FIG. 1B, the arithmetic average attenuation constant (α) is 0.16 dB/mm with w=150 µm, $h_1$=65 µm and $h_2$=65 µm, which is the best result in the exemplary parameter study. With $h_1$ or $h_2$ increasing, α will decrease, however increasing these height parameters will generally make fabrication of the DML structure more difficult. Therefore, for DML circuits according to certain embodiments herein the parameters w, $h_1$ and $h_2$ are selected to be w=150 µm, $h_1$=65 µm and $h_2$=65 µm as the optimized parameters. FIG. 1C shows the simulated loss contributions of the DML fabricated using the foregoing parameter values, wherein the $SiO_2$ and Si contribute 30% and 67%, respectively. It should be appreciated that the finite resistivity of the HR—Si introduces the conductor loss and that the radiation loss can be ignored for the contribution of 3%. The complex magnitude E-field distribution ($F^y_{11}$ mode) of the DML in the x-y plane at 850 GHz is shown in FIG. 1D. It can be appreciated from the illustration of FIG. 1D that the EM energy mainly distributes in the $SiO_2$ layer (layer 112 of FIG. 1A).

Figure 2A:
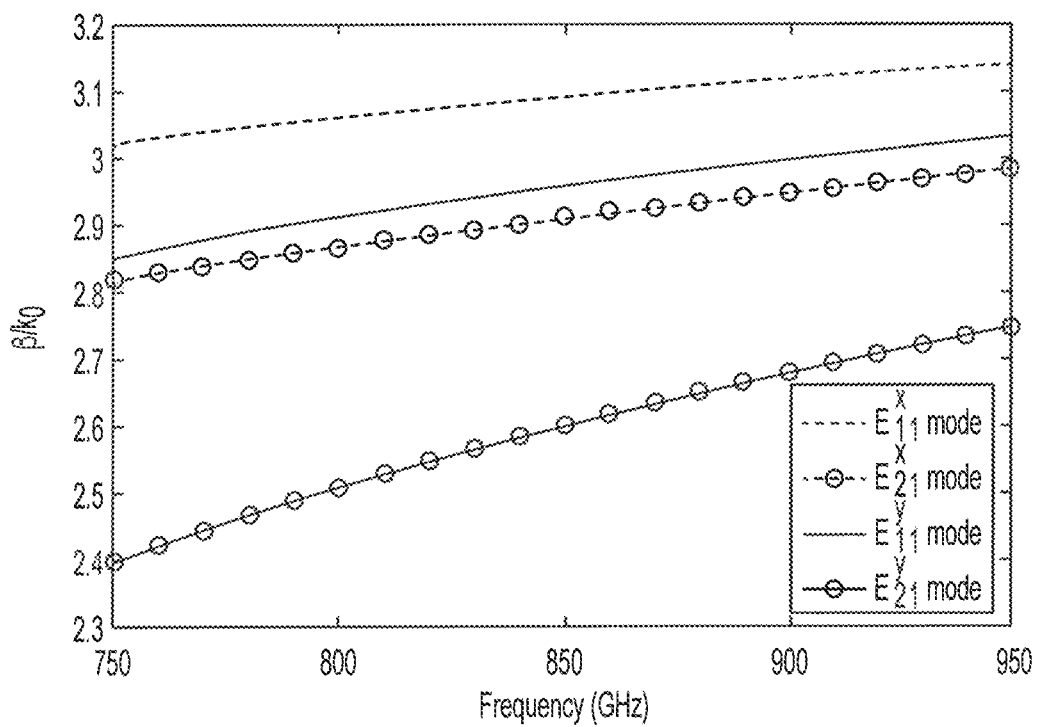
FIG. 2A shows normalized phase constant data of a DML structure as may be utilized according to embodiments of the invention.
Figure 2B:
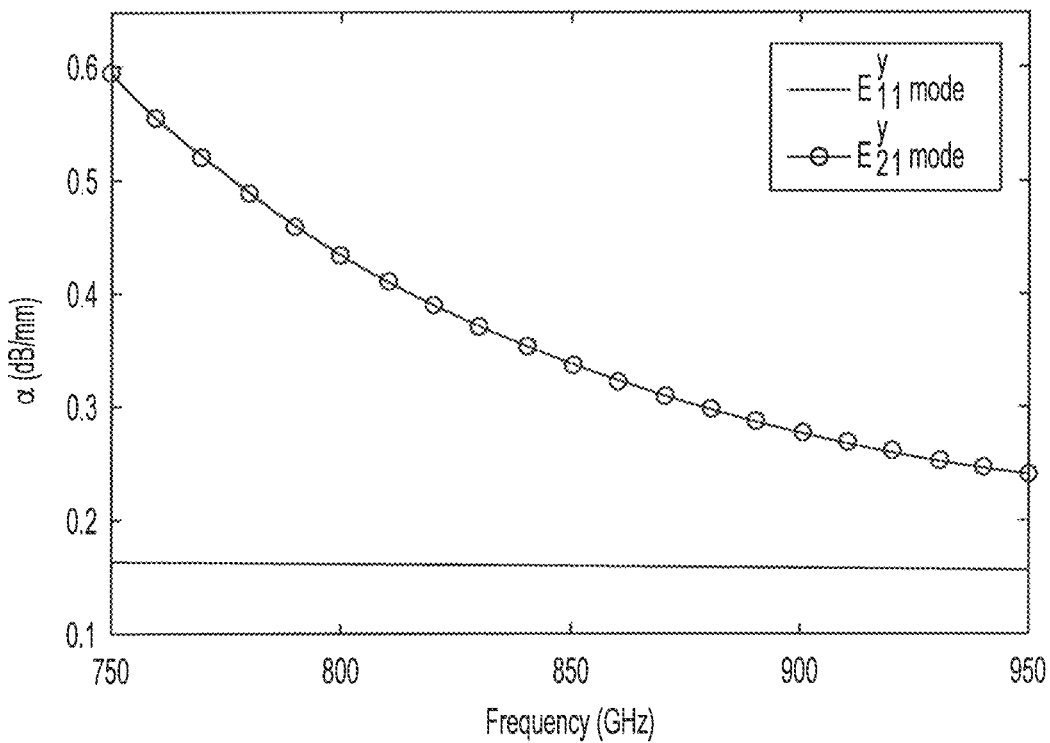
FIG. 2B shows attenuation constant data of a DML structure as may be utilized according to embodiments of the invention.

FIGS. 2A and 2B illustrate propagation constant data of the DML, wherein FIG. 2A shows normalized phase constant data and FIG. 2B shows attenuation constant data. In particular, FIG. 2A shows the normalized phase constant (β/k0) for the first two $E^x_{mn}$ modes ($E^x_{11}$ and $E^x_{21}$) and two $E^x_{mn}$ modes ($E^y_{11}$ and $E^y_{21}$) of the DML with dimensions w=150 µm, $h_1$=65 µm, $h_2$=65 µm and t=2 µm. It should be appreciated that, because y-direction polarization is used to excite the DML, the $E^x_{mn}$ modes are not propagated in the DML and with an even symmetry excitation source, the odd symmetry higher-order $E^y_{21}$ mode is difficult to excite. FIG. 2B shows the attenuation constant (α) for the $E^y_{11}$ and $E^y_{21}$ modes. It can be seen in the graph of FIG. 2B that the α of the $E^y_{21}$ mode, which is larger than that of the $E^y_{11}$ mode, decreases as the frequency increases. In the range of 925-950 GHz, the α values of the $E^y_{11}$ and $E^y_{21}$ modes are comparable, and the high-order $E^y_{21}$ mode may appear. Therefore, the operational frequency bandwidth of DML circuits according to certain embodiments herein is 750-925 GHz (e.g., the DML of embodiments is not designed for single-mode operation over 750-950 GHz).

Figure 3A:
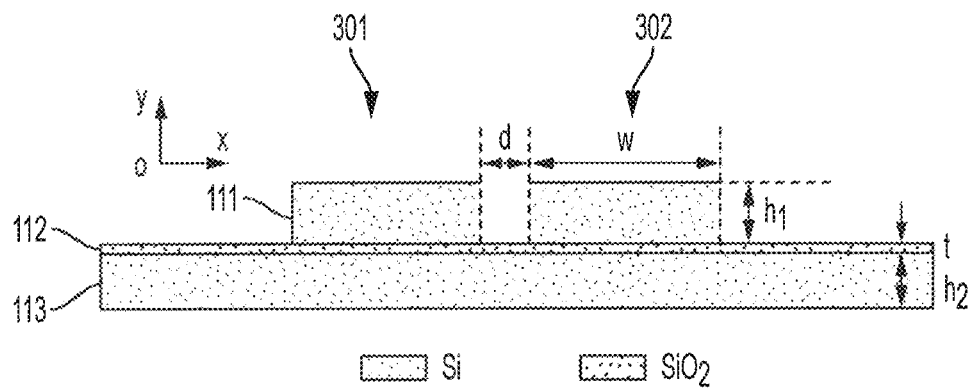
FIG. 3A shows a cross-sectional view of two DML structures disposed in proximity as may be utilized by DML circuits of embodiments of the invention.
Figure 3B:
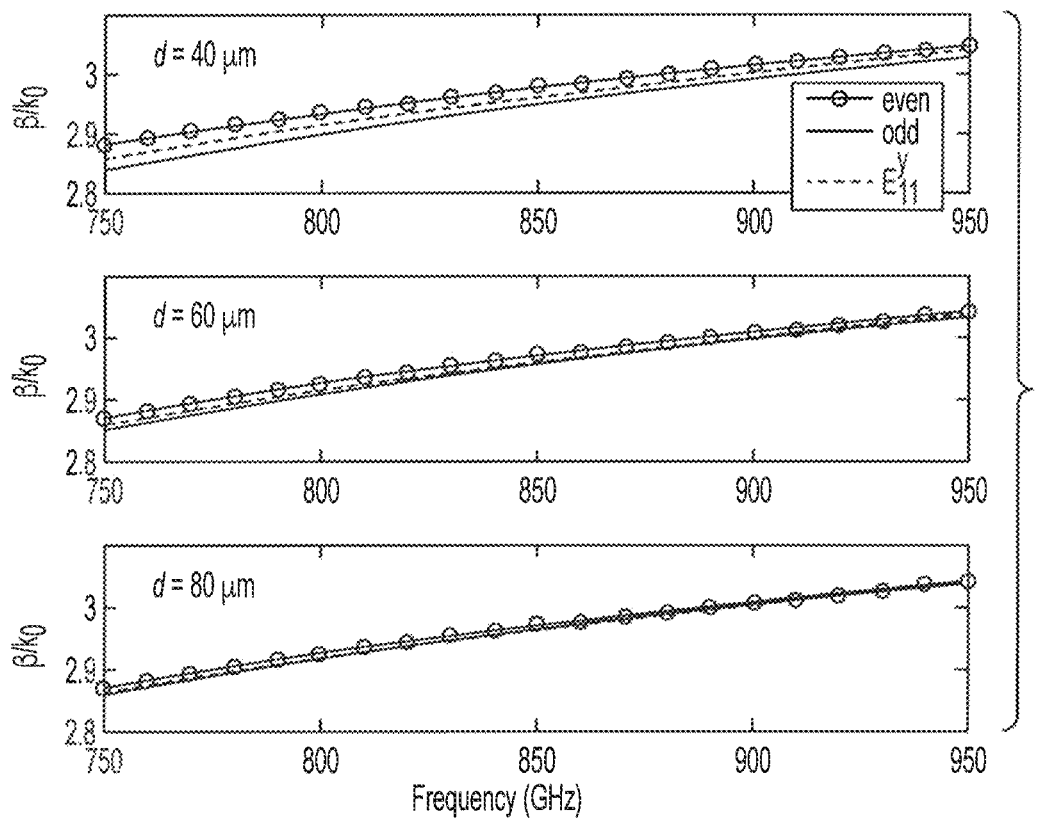
FIG. 3B shows the normalized dispersions of the $E^y_{11}$ mode of a single DML structure and the even and odd modes of two adjacent DML structures as may be utilized according to embodiments of the invention.

Embodiments of the present invention utilize DML structures, such as the foregoing DML structures optimized for 750-925 GHz operational frequency bandwidth, in implementing various circuits. For example, DML structures configured according to the concepts herein may be utilized in the design of a plurality of passive components, such as crossovers, couplers, etc. It should be appreciated, however, that various circuit implementations using DML circuits of embodiments of the present invention may comprise a plurality of DML structures in proximity, potentially resulting in coupling therebetween. FIG. 3A illustrates a scenario in which two DML structures (DML structures 301 and 302) are disposed with a distance of d (not to scale) between. FIG. 3B provides data useful in comparing such adjacent DML structures (e.g., DML structures 301 and 302 of FIG. 3A) with a single DML structure (e.g., DML structure 101 of FIG. 1A). In particular, FIG. 3B shows the normalized dispersions of the $E^y_{11}$ mode of a single DML structure and the even and odd modes of two adjacent DML structures at distances from 40 µm to 80 µm for DML structures configured with dimensions w=150 µm, $h_1$=65 µm and $h_2$=65 µm and t=2 µm. It can be appreciated from the data of FIG. 3B that as d increases, the normalized dispersions of the three modes become closer, and when d≥80 µm, they become the same line and the differences are negligible.

Figures 4A, 4B:
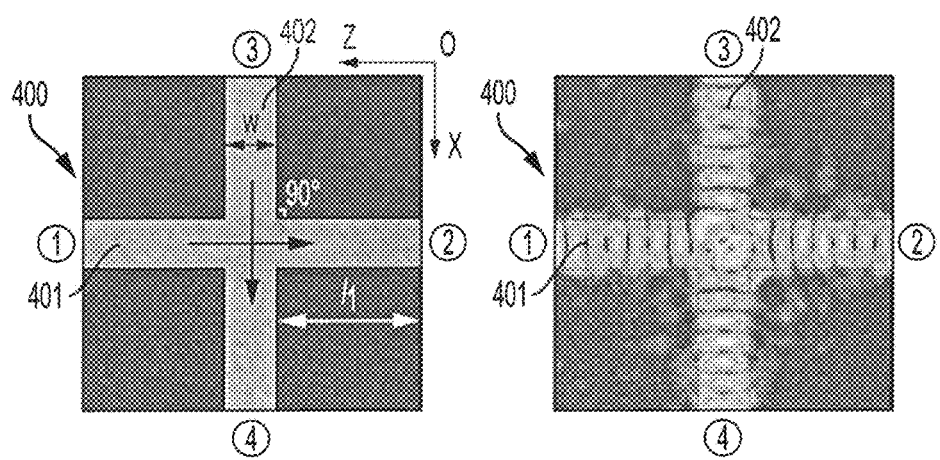
FIG. 4A shows a top view of a crossover circuit implemented using DML structures of embodiments of the invention.
FIG. 4B shows the H-field distribution in the $SiO_2$ layer of a DML crossover circuit of embodiments of the invention.

A crossover circuit (top view) implemented using DML structures of embodiments of the invention is shown in FIG. 4A. DML crossover circuit 400 of FIG. 4A comprises two mutually perpendicular DML structures (DML structures 401 and 402), such as may each comprise DMLs with dimensions w=150 µm, $h_1$=65 µm, $h_2$=65 µm and t=2 µm as described above, in the same plane. Taking advantage of the $E^y_{11}$ mode propagated in the DML, EM energy excited in port 1 of DML structure 401 cannot easily be transmitted to port 3 or port 4 of DML structure 402. Similarly, EM energy excited in port 3 of DML structure 402 cannot easily be transmitted to port 1 or port 2 of DML structure 401. Accordingly, the exemplary circuit configuration is well suited for providing a crossover circuit implementation having good isolation (e.g., on the order of 25.45±5.54 dB) between the crossing signal paths.

Figures 4C, 4D:
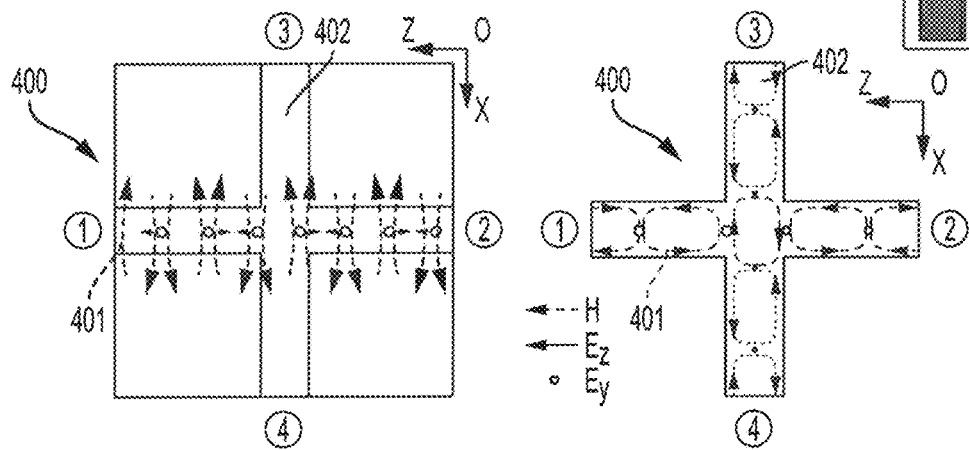
FIG. 4C shows the EM vector distribution in the $SiO_2$ layer of a DML crossover circuit of embodiments of the invention.
FIG. 4D shows the EM vector distribution of a rectangular metallic waveguide-based crossover structure.

FIGS. 4B and 4C show the signal energy distribution of DML crossover circuit 400, wherein FIG. 4B shows the H-field distribution and FIG. 4C shows the EM vector distribution of the DML based crossover circuit illustrated in FIG. 4A. In particular, FIG. 4B shows the H-field distribution in the $SiO_2$ layer of DML crossover circuit 400 resulting from two signals with the same phase and magnitude excited at port 1 of DML structure 401 and port 3 of DML structure 402. FIG. 4C shows the EM vector distribution of DML crossover circuit 400 when excited in port 1 of DML structure 401. As can be appreciated from the illustration of FIG. 4C, the DML has an $E_z$ component when excited in port 1 of DML structure 401 which is difficult to excite the $E^y_{11}$ mode in port 3 or port 4 of DML structure 402 for the format matching. FIG. 4D shows the EM vector distribution of a rectangular metallic waveguide-based crossover structure for comparison. As can be appreciated from FIG. 4D, different from the EM vector distribution of the DML-based crossover of FIG. 4C, the $E_z$ component does not exist, which is easy to excite the $TE_{10}$ mode in port 3 and port 4 of DML structure 402, as shown in FIG. 4D.

Figure 4E:
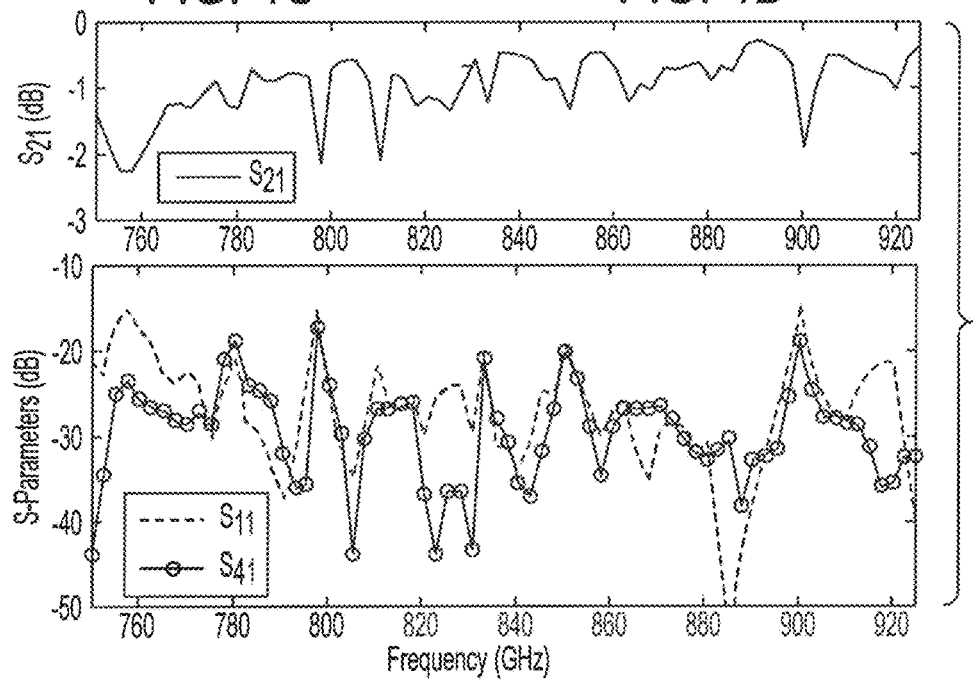
FIG. 4E shows simulated results of crossover operation of a DML crossover circuit of embodiments of the invention.

Simulated results of crossover operation of DML crossover circuit 400 are shown in FIG. 4E. In particular, the simulated S-parameters of the crossover provided by DML crossover circuit 400 (w=150 µm and $l_1$=425 µm) are shown in FIG. 4E. As can be appreciated from FIG. 4E, the average insertion loss between the input port and the through port is 0.95 dB and, except for some special frequency points, the return loss and isolation are both larger than 20 dB.

A coupler circuit (top view) implemented using DML structures of embodiments of the invention is shown in FIG. 5A. DML coupler circuit 500 of FIG. 5A comprises two DML structures (DML structures 501 and 502), such as may each comprise DMLs with dimensions w=150 µm, $h_1$=65 µm, $h_2$=65 µm and t=2 µm as described above, with a 45° intersection in the same plane. The relatively simple structure of DML coupler circuit 500 realizes a weak coupling between DML structure 501 and DML structure 502. In operation, for an $E^y_{11}$ mode excited at port 1 of DML structure 501, the main part of the EM energy is transmitted to port 2 of DML structure 501, although a weak coupling can be extracted from port 3 of DML structure 502. FIG. 5B shows the H-field distribution in the SiO$_2$ layer of DML coupler circuit 500 resulting from the $E^y_{11}$ mode excited at port 1 of DML structure 501.

Simulated results of coupling operation of DML coupler 500 are shown in FIG. 5C. In particular, the simulated S-parameter and phase difference between the through port and the coupler port provided by DML coupler circuit 500 (w=150 μm and $l_2$=1167 μm) are shown in FIG. 5C. As can be appreciated from FIG. 5C, the insertion loss between the input port and the through port is smaller than 1.42 dB, the coupling factor is approximately 14.40 dB, the return loss of port 1 of DML structure 501 is larger than 22.88 dB, the isolation between port 1 of DML structure 401 and port 4 of DML structure 502 is larger than 24.79 dB, and the phase difference of DML coupler 500 is 90°±12°.

It should be appreciated that measurement of signals excited in DML circuits of embodiments herein (e.g., optimized for 750-925 GHz operational frequency bandwidth) presents a challenge, and thus measurement of the performance of such DML circuits (e.g., to collect data such as shown in FIGS. 1B, 1C, 2A, 2B, 3B, 4E, and 5C above) may be difficult without suitable measurement technology. For example, the THz frequency band represents a region in the electromagnetic spectrum where the frequency of electromagnetic radiation becomes too high to be measured digitally via electronic counters, and thus measurements may be made by proxy using the properties of wavelength and energy. Further, it is extremely difficult to insert DML circuits operable in 750-925 (Hz frequencies into the interface of a waveguide used in testing such DML circuits. For example, the test waveguide may comprise a very small rectangular waveguide, such as a WR01 waveguide configuration having inside dimensions of 254 μm×127 μm. Accordingly, embodiments of the invention provide a non-contact measurement technology used to test DML circuits fabricated in accordance with the concepts herein.

Figure 6:
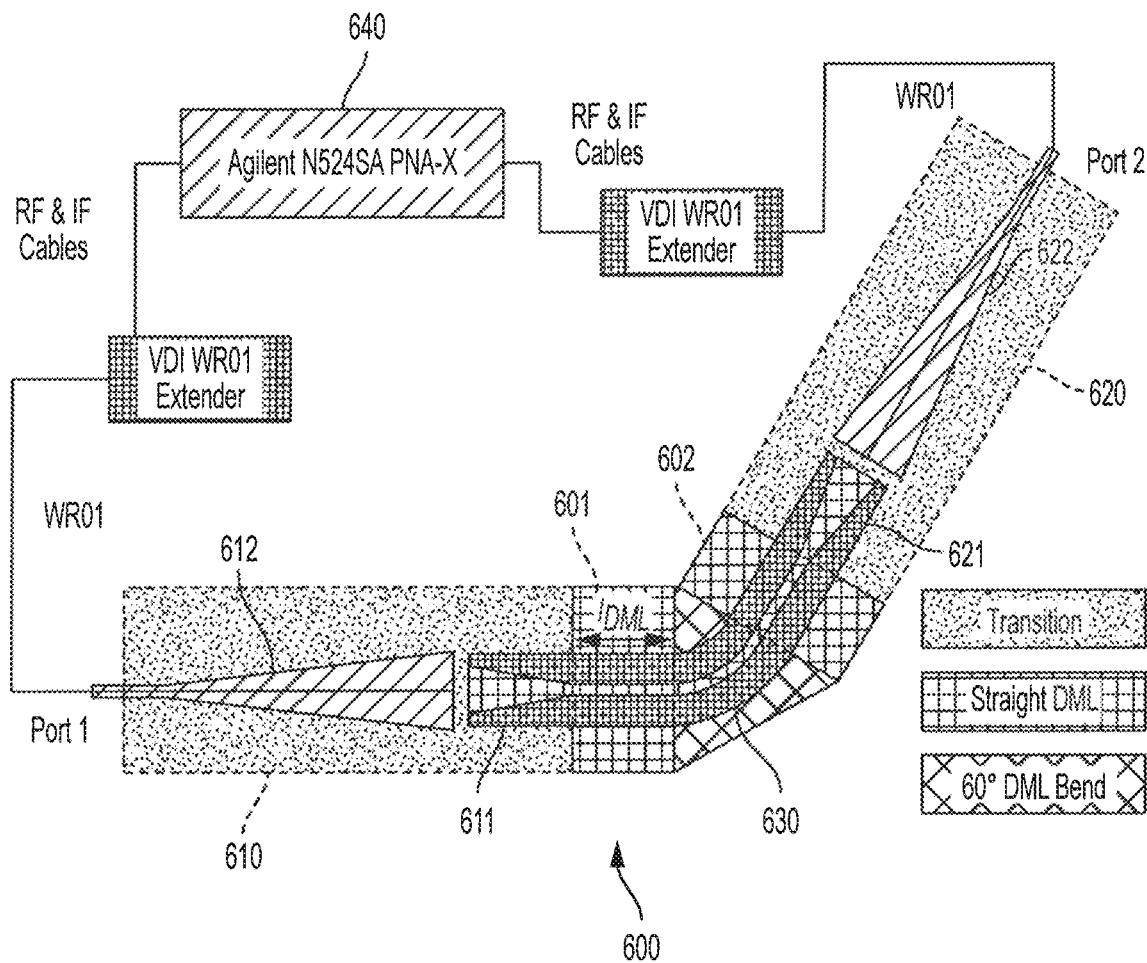
FIG. 6 shows an exemplary non-contact measurement system configured for use in testing DML circuits of embodiments of the present invention.

FIG. 6 shows an exemplary non-contact measurement system configured for use in testing DML circuits of embodiments of the present invention. In non-contact measurement system 600 of FIG. 6 DML structures 601 and 602 (e.g., comprising straight DMLs with length $l_{DML}$ in the illustrated embodiment) are under test. Non-contact measurement system 600 of the illustrated embodiment includes measurement interfaces 610 and 620 configured to place DML structures 601 and 602 under test in communication with signal analyzer 640, such as via appropriate waveguides, frequency extenders, cables, etc. To facilitate non-contact measurement according to the illustrated embodiment of FIG. 6, measurement interfaces 610 and 620 provide two transitions comprising a plurality of horn antennas having a space (e.g., 0.4 mm) between. In particular, measurement interface 610 comprises horn antennas 611 and 612 (e.g., a H-plane dielectric horn antenna and a WR01 diagonal horn antenna, respectively) and measurement interface 620 comprises horn antennas 621 and 622 (e.g., a H-plane dielectric horn antenna and a WR01 diagonal horn antenna configuration, respectively). Bend 630 (e.g., a 60° bend based on the DML) of non-contact measurement system 600 of embodiments is provided for avoiding direct transmission between the horn antennas 612 and 622.

Figure 7A:
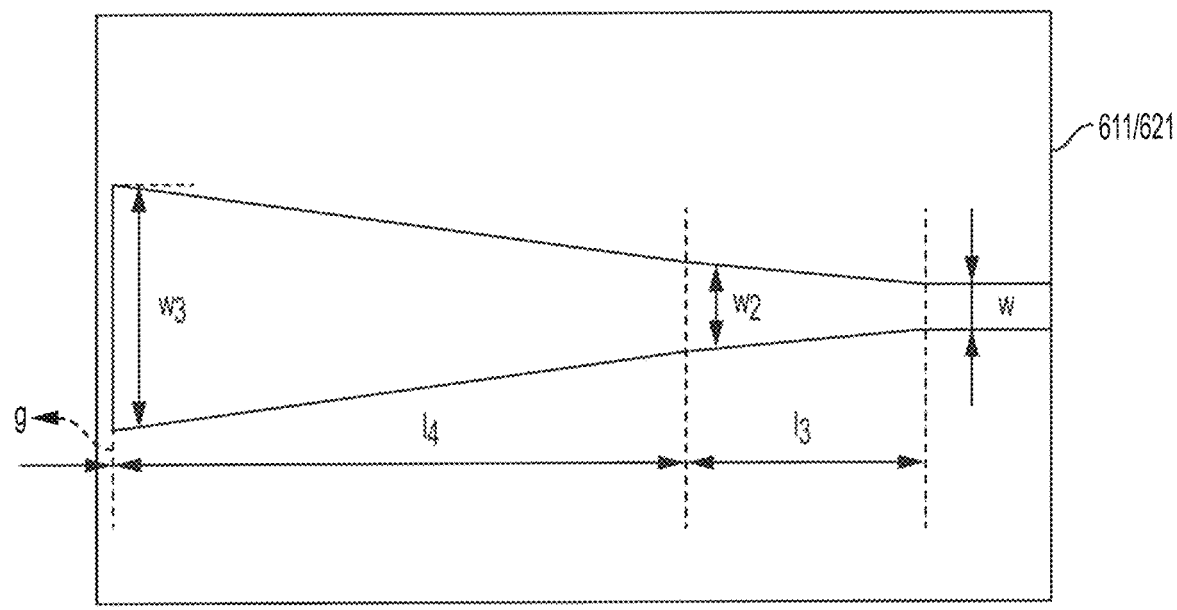
FIG. 7A shows a top view of an implementation of H-plane dielectric horn antennas based on DML as may be utilized according to embodiments of the invention.
Figure 7B:
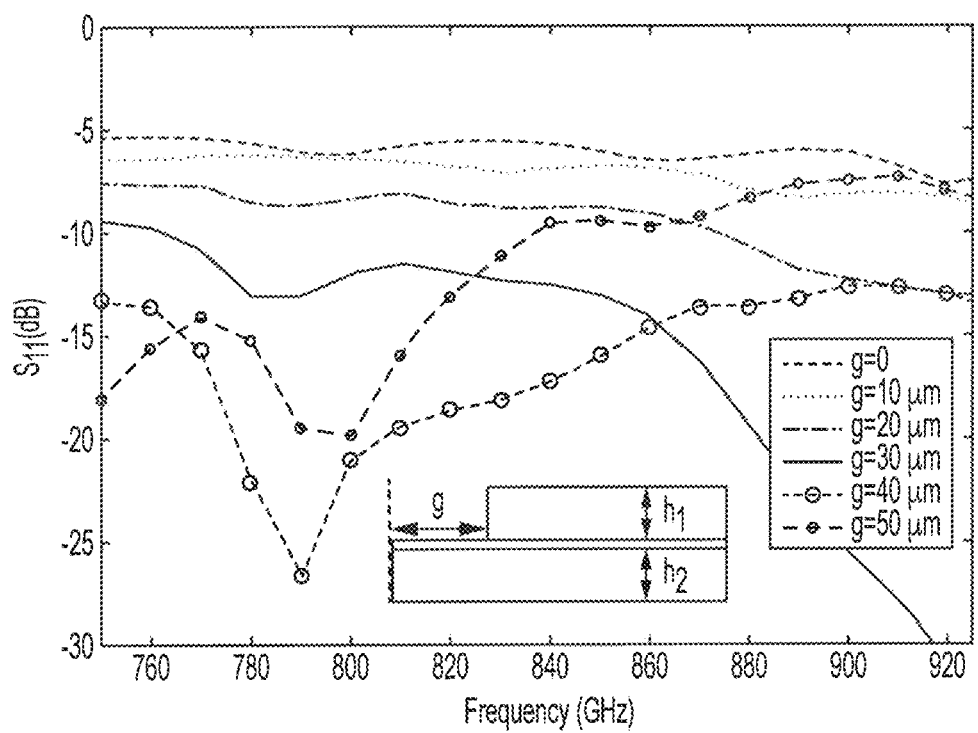
FIG. 7B shows the simulated $S_{11}$ of the antenna configuration of FIG. 7A.

An implementation of horn antennas 611 and 621 configured as H-plane dielectric horn antennas based on DML are shown in FIG. 7A. An embodiment of horn antennas 611 and 621 implemented as shown in FIG. 7A may, for example, be configured with dimensions w=150 μm, $w_2$=300 μm, $w_3$=819 μm, $l_3$=850 μm, and $l_4$=1846 μm for use with DMLs under test configured in accordance with the concepts herein (e.g., optimized for 750-925 GHz operational frequency bandwidth, such as with dimensions w=150 μm, $h_1$=65 μm, $h_2$=65 μm and t=2 μm). It should be appreciated that the return loss of the exemplary H-plane dielectric horn antenna configuration of FIG. 7A is sensitive to the length (g) of the dielectric extension area. Accordingly, embodiments of horn antennas implemented as shown in FIG. 7A configure the length of the dielectric extension area (e.g., select g) to match the dielectric horn antenna and the free space. Data showing the relationship between g and $S_{11}$ is shown in FIG. 7B. In particular, FIG. 7B shows the simulated $S_{11}$ of the antenna configuration of FIG. 7A at various g (swept from 0 to 50 μm). As can be appreciated from FIG. 7B, when g equals 40 μm the return loss is larger than 12.64 dB. Considering a 5 μm undercut width caused by DRIE, embodiments set g as 45.6 μm in the mask design used to fabricate the H-plane dielectric horn antenna, wherein the added 5.6 μm is a margin for the fabrication.

Figure 8A:
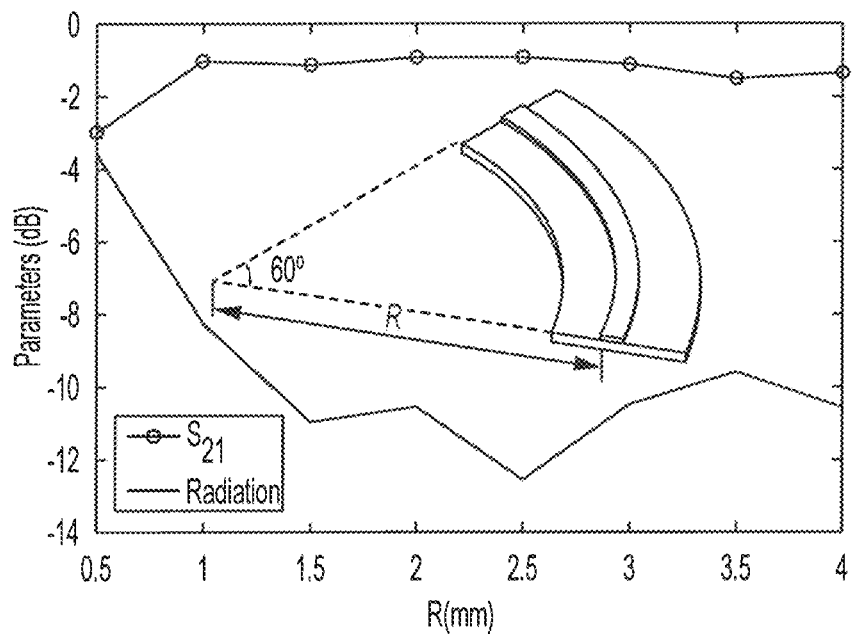
FIG. 8A shows a 3D DML bend structure, and its associated performance, as may be utilized according to embodiments of the invention.
Figure 8B:
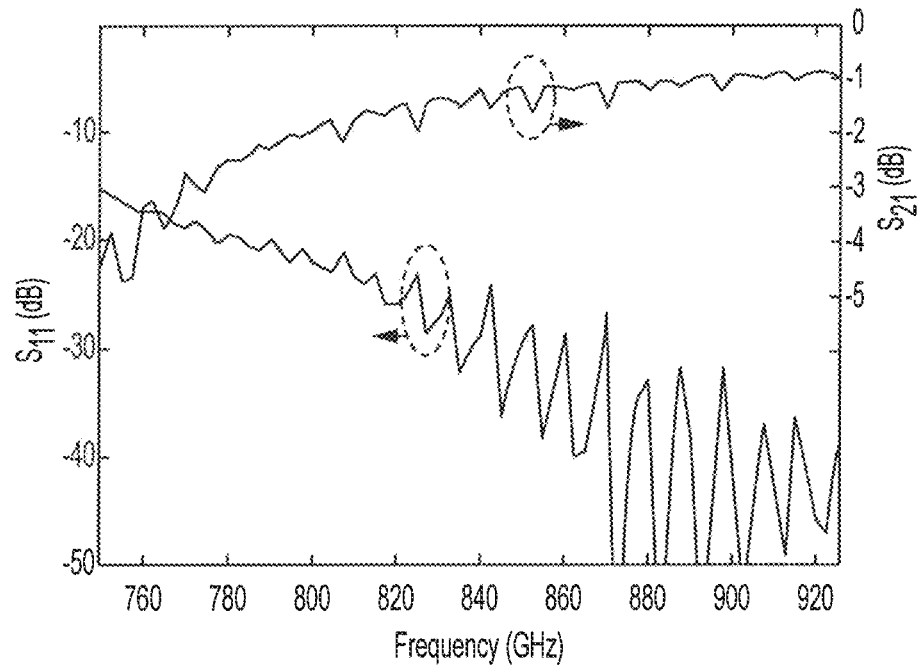
FIG. 8B shows the simulated S-parameter of the DML bend of FIG. 8A.

An implementation of bend 630 configured as a 60° DML bend is shown in FIG. 8A. In particular, FIG. 8A shows the 3D structure of a 60° DML bend and the performance of the 60' DML bend at 850 GHz for different turning radiuses of R. It can be appreciated from FIG. 8A that, if the radius R of the bend is too small (e.g., R=0.5 mm), the radiation of the bend will be very large and the bend does not function satisfactory for use in non-contact measurement system 600 of embodiments. However, if the radius R of the bend is too large (e.g., R=4 mm), the added arc length increases the insertion loss of the bend. Accordingly, a reasonable range for the radius R of the bend is 1.5-3.5 mm. Embodiments of non-contact measurement system 600 utilize a sufficiently large radius R of bend 630 (e.g., R=3.1 mm) facilitate easy handling, transfer, and testing. FIG. 8B shows the simulated S-parameter of the 60 DML bend configuration of FIG. 8A (R=3.1 mm). As shown in FIG. 8B, the return loss of the bend is larger than 15 dB and the insertion loss of the bend decreases as the frequency increases because R of the bend is not optimally large for the low-frequency band 750-780 GHz).

Figure 9A:
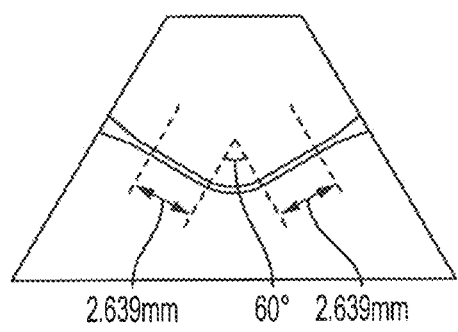
FIGS. 9A-9E show integrated implementations of DML samples as may be fabricated according to embodiments of the invention.
Figure 9B:
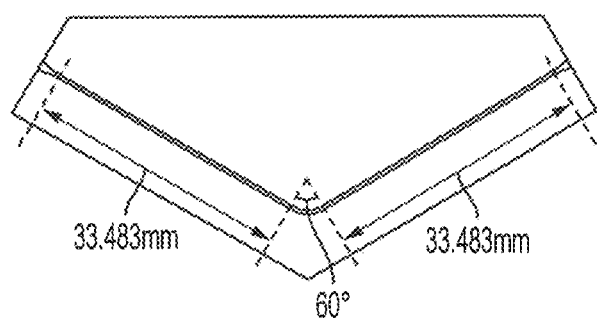
Figure 9C:
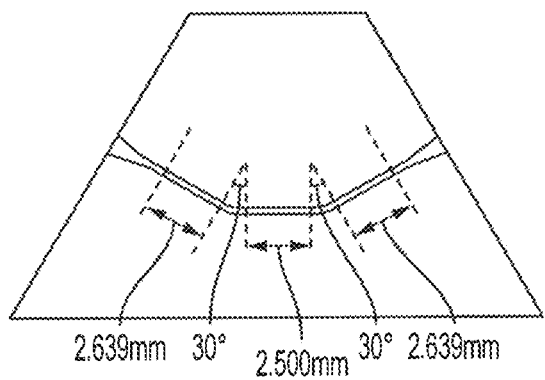
Figure 9D:
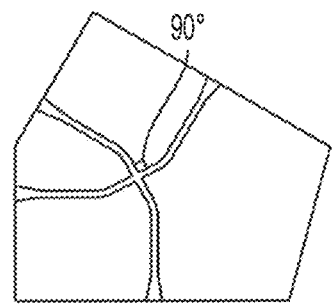
Figure 9E:
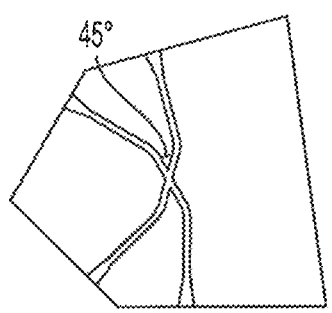

Various DML circuits and their components may be synthesized for measurement and analysis using non-contact measurement systems in accordance with the concepts herein. For example, an embodiment of the test configuration illustrated in FIG. 6 may be fabricated by integrating the H-plane dielectric horn antennas (e.g., horn antennas 611 and 621), the DML circuit transmission line components (e.g., DML structures 601 and 602), and the 60° DML bend (e.g., bend 630), wherein the H-plane dielectric horn antennas may be placed in proximity to respective WR01 diagonal horn antennas (e.g., horn antennas 612 and 622) of the non-contact measurement system (e.g., non-contact measurement system 600) for operation of the measurement system. FIG. 9A shows an integrated implementation of a small DML sample (e.g., length $l_{DML}$ of each arm of the small samples is 2.639 mm) corresponding to the exemplary DML structure under test of FIG. 6 and FIG. 9B shows an integrated implementation of a large DML sample (e.g., length $l_{DML}$ of each arm of the large DML samples is 33.483 mm) corresponding to the exemplary DML structure under test of FIG. 6. FIG. 9C shows a reference DML sample having a straight DML (2.5 mm) inserted into the middle of the 60° DML bend of the small DML sample of FIG. 9A. FIG. 9D shows an integrated implementation of a DML crossover circuit, such as that of FIG. 4A, comprising two mutually perpendicular DML samples, wherein the H-plane dielectric horn antennas thereof may be placed in proximity to respective diagonal horn antennas of the non-contact measurement system for operation of the measurement system. Similarly, FIG. 9E shows an integrated implementation of a DML coupler circuit, such as that of FIG. 5A, comprising two DML samples with a 45° angle, wherein the H-plane dielectric horn antennas thereof may be placed in proximity to respective diagonal horn antennas of the non-contact measurement system for operation of the measurement system.

Processes used to fabricate DML circuits of embodiments of the invention, such as the DML crossover circuit of FIG. 4A, the DML coupler circuit of FIG. 5A, and the DML sample circuits of FIGS. 9A-9E, may utilize photo lithographic and chemical processing steps in which the height of the dielectric microstrip lines can be accurately controlled according to embodiments. In particular, the $SiO_2$ layer can stop the DRIE process, used in fabricating a dielectric ribbon of the DML circuits, due to the etch selectivity between Si and $SiO_2$, in operation of the fabrication process implemented according to embodiments.

Figure 10:
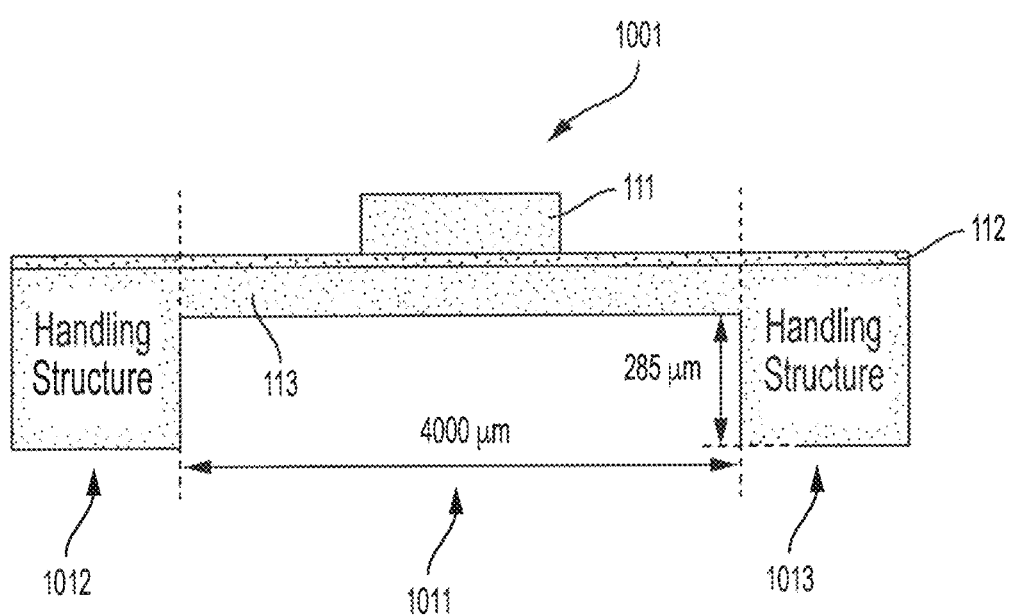
FIG. 10 shows a cross-section view of a DML structure fabricated according to embodiments of the invention.

A 100-mm-diameter double-side polished SOI wafer may, for example, be used as a substrate for fabrication of embodiments of a DML circuit. FIG. 10 shows cross-section view of DML structure 1001 (not to scale) fabricated using such a substrate in a fabrication process of embodiments herein. DML structure 1001 fabricated according to the concepts herein comprises layers 111 and 113, wherein layer 113 comprises a handle layer (e.g., HR—Si having thickness=350 μm), layer 111 comprises a device layer (e.g., HR—Si having thickness=65 μm), and layer 112 comprises an insulation layer (e.g., $SiO_2$ having thickness=2 μm). In accordance with embodiments of the invention, the device and handle layers (layers 111 and 113) comprise Si layers having a <1, 0, 0> crystal orientation and a high resistivity ($\rho \geq 800$ Ω·cm).

It should be appreciated that the exemplary DML structure illustrated in FIG. 10 comprises membrane area 1011 forming the bottom layer of the DML structure and connecting handling structures 1012 and 1013. In accordance with embodiments of the invention, handling structures 1012 and 1013 are relatively thick (e.g., 285 μm) and are configured to enhance the mechanical strength of the DML circuit.

A plurality of photolithography masks may be utilized in a process to fabricate DML structures such as that of FIG. 10. The masks utilized in a fabrication process of embodiments may, for example, include masks for both frontside etching (e.g., to fabricate DML structures) and backside etching (e.g., to fabricate handling structures) of a SOI wafer.

Figure 11A:
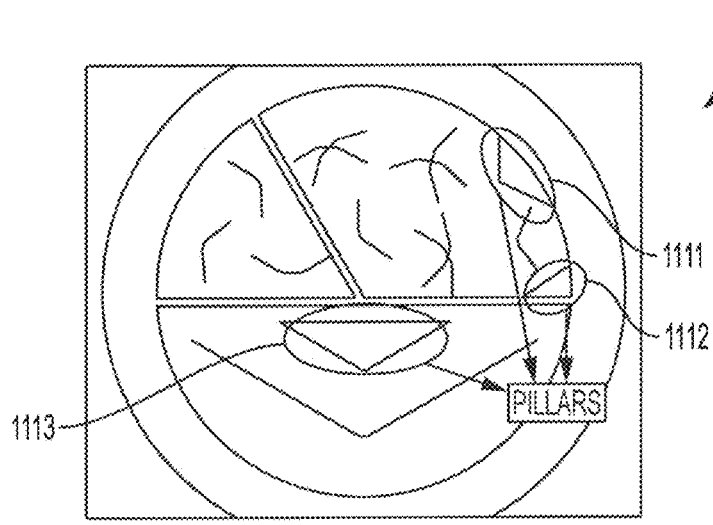
FIGS. 11A-11C show masks as may be utilized in a fabrication process of embodiments of the invention.
Figure 11B:
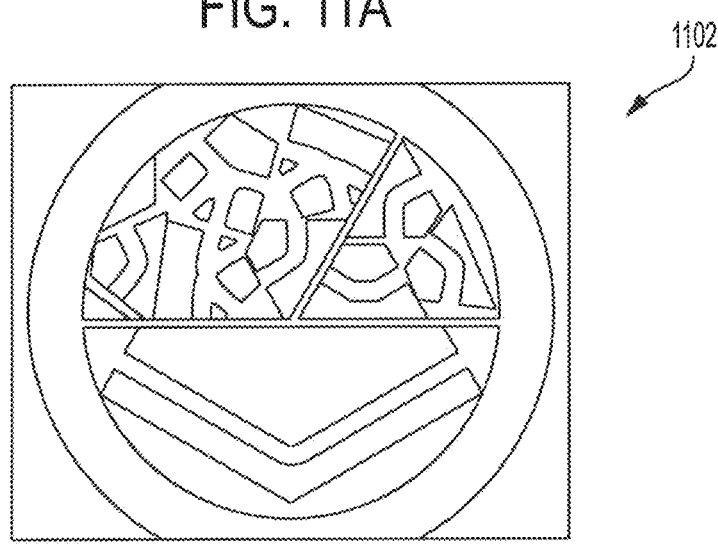
Figure 11C:
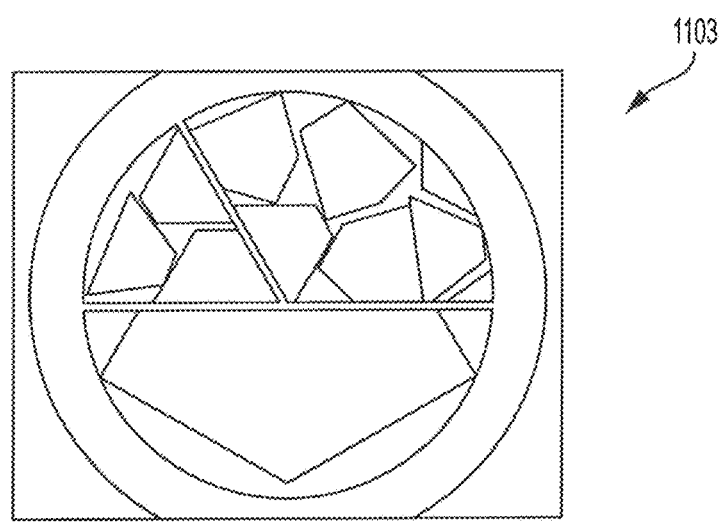

Three masks as may be utilized in a fabrication process of embodiments herein are shown in FIGS. 11A-11C. The exemplary masks of FIGS. 11A-11C include mask 1101 (FIG. 11A) and mask 1103 (FIG. 11B) configured for frontside etching and mask 1102 (FIG. 11B) configured for backside etching. The exemplary masks of FIGS. 11A-11C provide for fabrication of (include) four small DML samples (e.g., corresponding to the example of FIG. 9A), one large DML sample (e.g., corresponding to the example of FIG. 9B), one reference sample (e.g., corresponding to the example of FIG. 9C), one crossover circuit (e.g., corresponding to the example of FIG. 9D), and two coupler circuits (e.g., corresponding to the example of FIG. 9E) using the masks.

Embodiments of masks utilized in fabrication of DML circuits herein are preferably configured to make the SOI wafer more flat and/or stable when etched. For example, the exemplary mask of FIG. 11A includes pillars 1111-1113 disposed at positions configured to make the wafer more flat and stable when the SOI wafer is etched from the backside. Moreover, the exemplary masks of FIGS. 11A-11C each include a beam (e.g., a "Y"-shaped beam configuration) disposed and shaped to provide mechanical support to prevent the membrane from cracking during the last backside etching step. The use of such pillars and beams of embodiments, although not forming part of the DML circuits being fabricated, improve the yield of the DML samples.

Figure 12A:
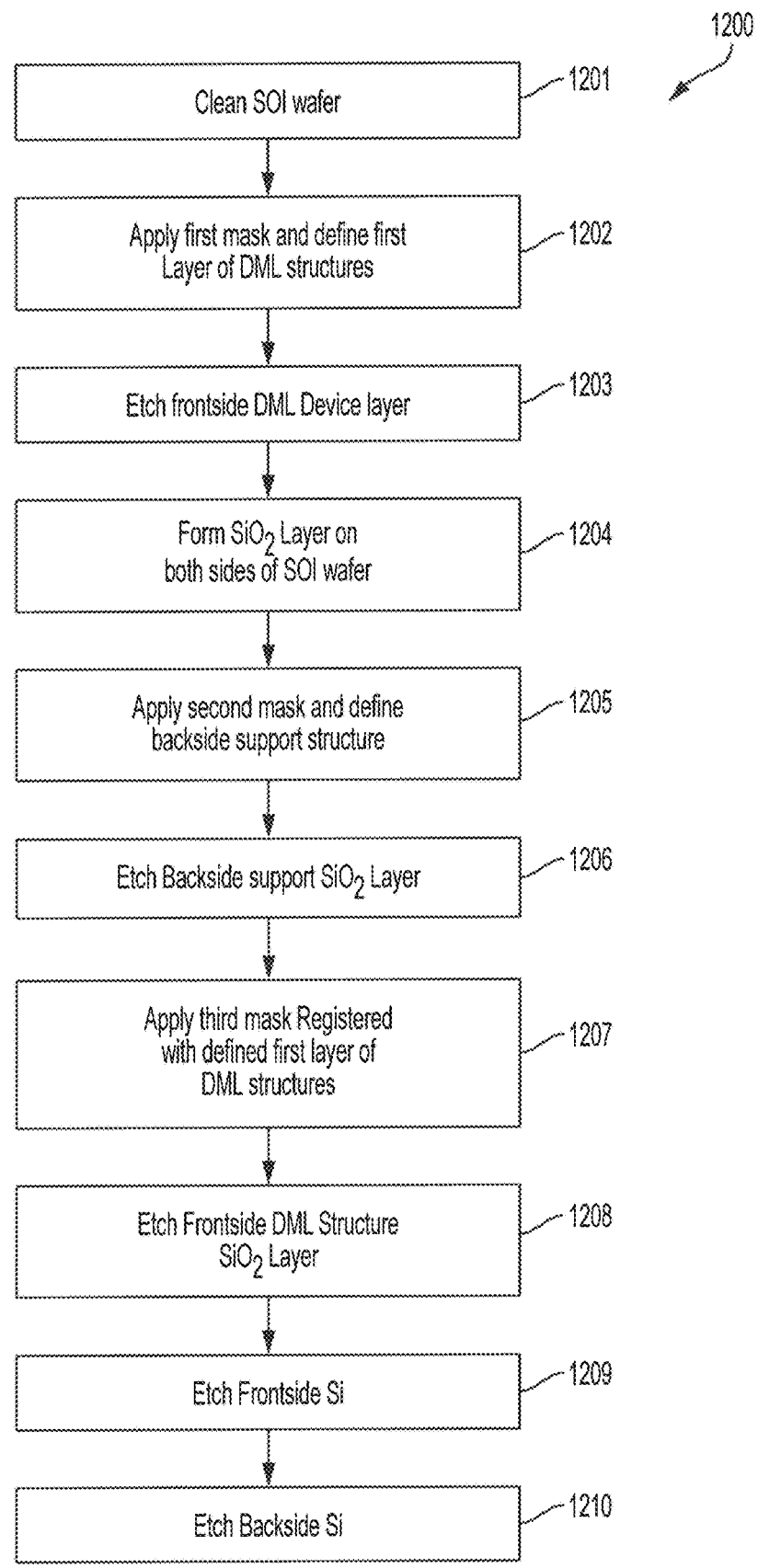
FIGS. 12A and 12B illustrate a fabrication process to provide DML circuits according to embodiments of the invention.
Figure 12B:
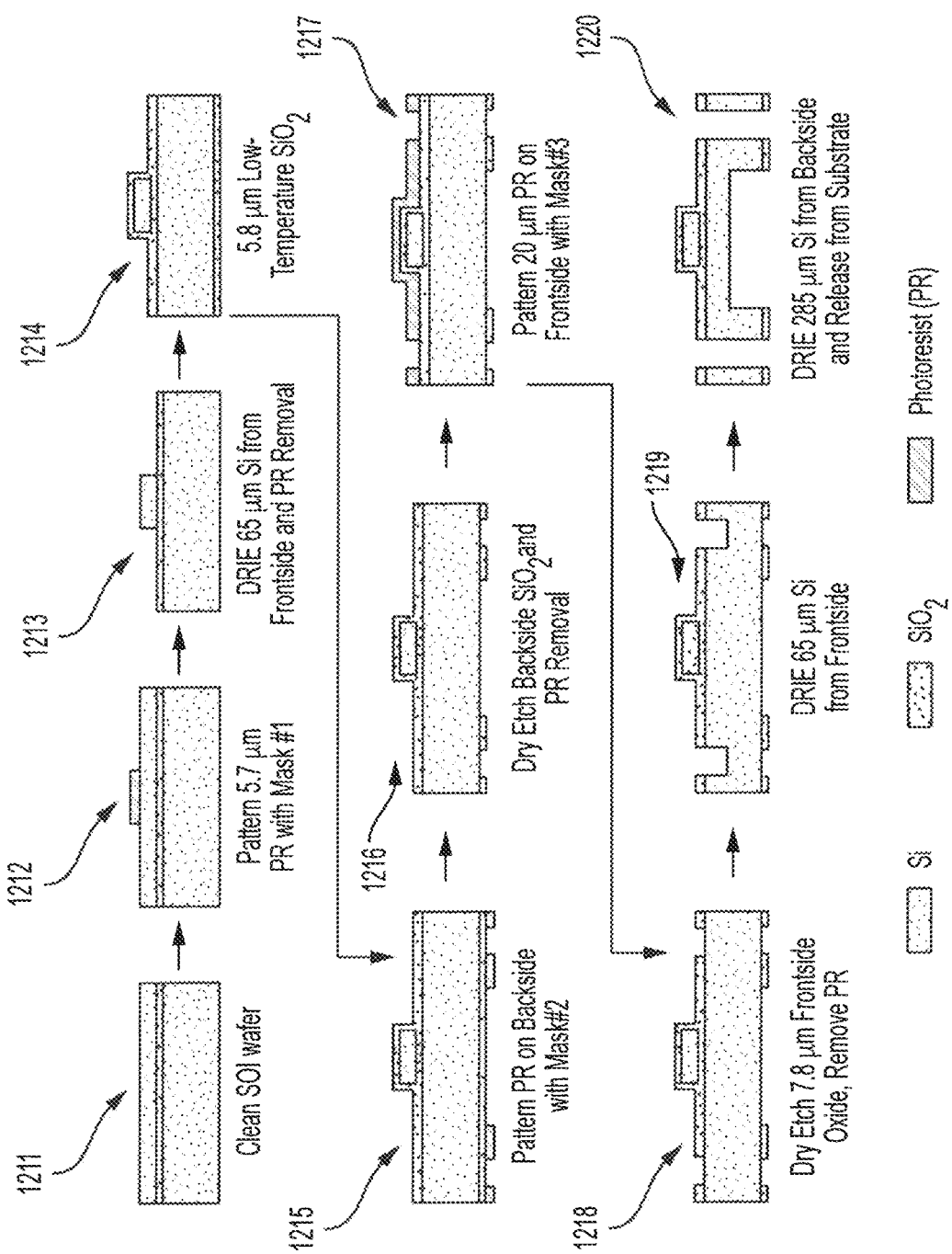

FIGS. 12A and 12B illustrate a fabrication process to provide DML circuits according to embodiments herein. In particular, FIG. 12A shows flow 1200 comprising process steps for fabricating DML circuits according to embodiments. Correspondingly, FIG. 12B shows cross-sections of a portion of a SOI wafer at each process step of flow 1200. As will be appreciated from the discussion that follows, the exemplary fabrication process of FIGS. 12A and 12B facilitates fabrication of handling structure, such as handling structures 1012 and 1013 of FIG. 10, in association with the fabricated DML circuits.

In operation according to the embodiment of flow 1200 illustrated in FIG. 12A, the SOI wafer from which the DML circuits are to be fabricated is cleaned at block 1201. For example, the SOI wafer may be cleaned with $H_2SO_4$: $H_2O_2$=10:1 and HF:$H_2O$=1:50 to provide clean SOI wafer 1211 of FIG. 12B.

At block 1202 of the illustrated embodiment, a mask is applied to the top (frontside) of the SOI wafer to define a layer of DML structures. For example, photoresist (PR) may be spin-coated (e.g., AZ4620 with a thickness of 5.7 μm) on the top surface of the SOI wafer. A first mask (e.g., mask 1101 of FIG. 11A) may be applied and the open areas of the PR coating photo-exposed (e.g., using UV radiation). The PR may then be developed to define the first DML structure (e.g., DML transmission lines) layer to provide PR mask patterned SOI wafer 1212 of FIG. 12B.

The developed PR is used at block 1203 of the illustrated embodiment to etch the frontside of the SOI wafer. For example, the top device layer may be etched by DRIE in Si (e.g., to a depth of 65 μm) to form the strip line structure. In operation according to embodiments of flow 1200, the $SiO_2$ acts as an etch stop. The remaining PR may be removed, such as by using an oxygen plasma, once the etching is complete to provide PR removed and etched SOI wafer 1213 of FIG. 12B.

At block 1204 of the embodiment illustrated in FIG. 12A a $SiO_2$ layer is formed on the SOI wafer (e.g., formed on the liontside, backside, and side walls of the etched wafer from block 1203) to protect the etched structure during further processing. For example, low-pressure chemical vapor deposition (LPCVD) may be used to form a $SiO_2$ layer (e.g., $SiO_2$ with a thickness of 5.8 μm) on all sides of the SOI wafer to provide $SiO_2$ encapsulated SOI wafer 1214 of FIG. 12B.

A mask is applied to the bottom (backside) of the SOI wafer to define backside support structure at block 1205 of flow 1200 illustrated in FIG. 12A. For example, PR may be spin-coated (e.g., AZ4620 with a thickness of 3 μm) on the bottom surface of the SOI wafer. A second mask (e.g., mask 1102 of FIG. 11B) may be applied and the open areas of the PR coating photo-exposed (e.g., using UV radiation). The PR may then be developed to define the support structure (e.g., handling structure) layer to provide PR mask patterned SOI wafer 1215 of FIG. 12B.

At block 1206 of the illustrated embodiment, the backside support layer of the SOI wafer is etched. For example, the $SiO_2$ on the backside of the SOI wafer may be etched by reactive ion etching (RIE). The remaining PR may be removed, such as by using an oxygen plasma, once the etching is complete to provide PR removed and etched SOI wafer 1216 of FIG. 12B.

A mask, registered with the defined first layer of DML structures, is applied to the top (frontside) of the SOI wafer at block 1207 of the illustrated embodiment of flow 1200. For example, the frontside of the SOI wafer may be spray-coated with PR (e.g., AZ9260: MEK: PGMEA=1:8:1 by weight, with a thickness of 20 μm). A third mask (e.g., mask 1103 of FIG. 11C) may be aligned using alignment marks on the backside and applied to the frontside of the SOI wafer. The open areas of the PR may be photo-exposed (e.g., using UV radiation) and the PR developed to provide PR mask patterned SOI wafer 1217 of FIG. 12B.

At block 1208 of the embodiment illustrated in FIG. 12A, the DML structure layer is etched. For example, the SiO2 on the frontside of the SOI wafer may be etched by RIE. The remaining PR may be stripped, such as by using an oxygen plasma, once the etching is complete to provide PR removed and etched SIM wafer 1218 of FIG. 12B.

The handle layer is etched to complete the fabrication of the fabricated DML circuits and to release the fabricated DML circuits from the SOI wafer at blocks 1209 and 1210 of the illustrated embodiment. For example, with the SOI wafer mounted on a support wafer, the handle layer may be etched by DRIE in the Si (e.g., to a depth of 65 μm) from the frontside (block 1209, providing frontside handle layer etched SOI wafer 1219 of FIG. 12B). The etch depth may, for example, be monitored using a Tencor P-10 surface profilometer. With the SOI wafer mounted on a carrier wafer, the handle layer may be etched using DRIE in the Si from the backside to create the bottom layer of the DML (block 1210). After etching through the 285-μm-thick handle wafer, the DML circuits are released from the carrier wafer providing released DML circuit 1220 of FIG. 12B. It should be appreciated that, because the sample is very thin and the remaining SiO$_2$ around the strip of the DML will not affect the performance of the DML, the remaining SiO$_2$ may not be removed according to embodiments.

Figure 13A:
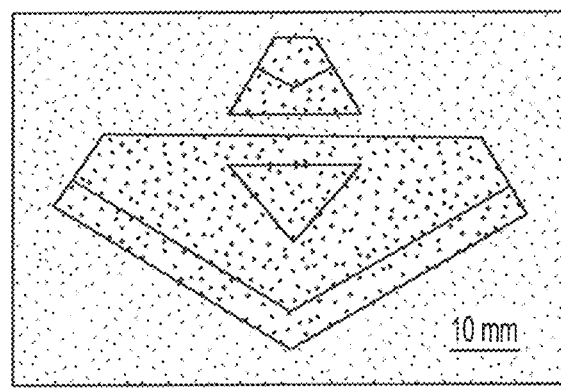
FIG. 13A shows a top view of small and large DML samples fabricated according to embodiments of the invention.
Figure 13B:
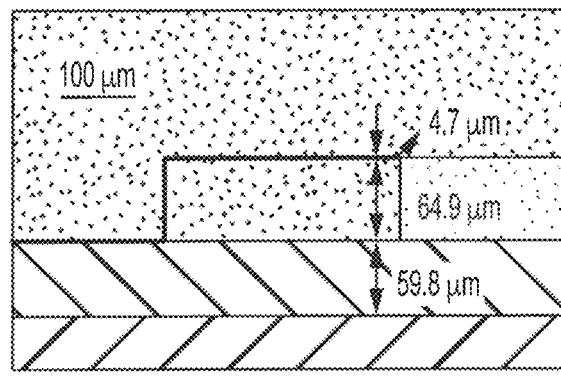
FIG. 13B shows a scanning electron micrograph (SEM) displaying the cross-section of the fabricated DML samples of FIG. 13A.

FIG. 13A shows a top view of small and large DML samples (e.g., corresponding to the configurations of FIGS. 9A and 9B) fabricated using a process in accordance with flow 1200 of FIG. 12A. FIG. 13B shows a scanning electron micrograph (SEM) displaying the cross-section of the fabricated DML samples of FIG. 13A, From the SEM of FIG. 13E it can be appreciated that the remaining SiO$_2$ thickness of the exemplary sample is 4.7 μm, the strip height of the exemplary sample fabricated device is 64.9 μm, and the thickness of the exemplary sample fabricated device bottom layer is 59.8 μm.

Figure 13C:
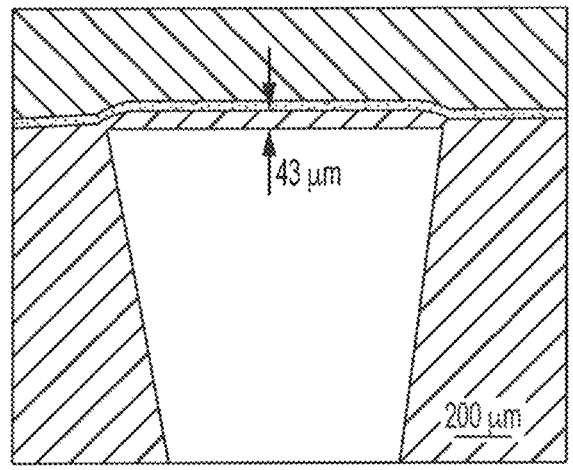
FIG. 13C shows a top view of a H-plane dielectric horn antenna based on the DML fabricated according to embodiments of the invention.

FIG. 13C shows a top view of a H-plane dielectric horn antenna based on the DML (e.g., corresponding to the configuration of FIG. 7) fabricated using a process in accordance with flow 1200 of FIG. 12A. It can be appreciated from the illustration of FIG. 13C that the edge extension area (g) of the middle and bottom layers of the exemplary sample fabricated horn antenna is 43 μm and the undercut width caused by the DRIE is 2.6 μm.

Figure 14:
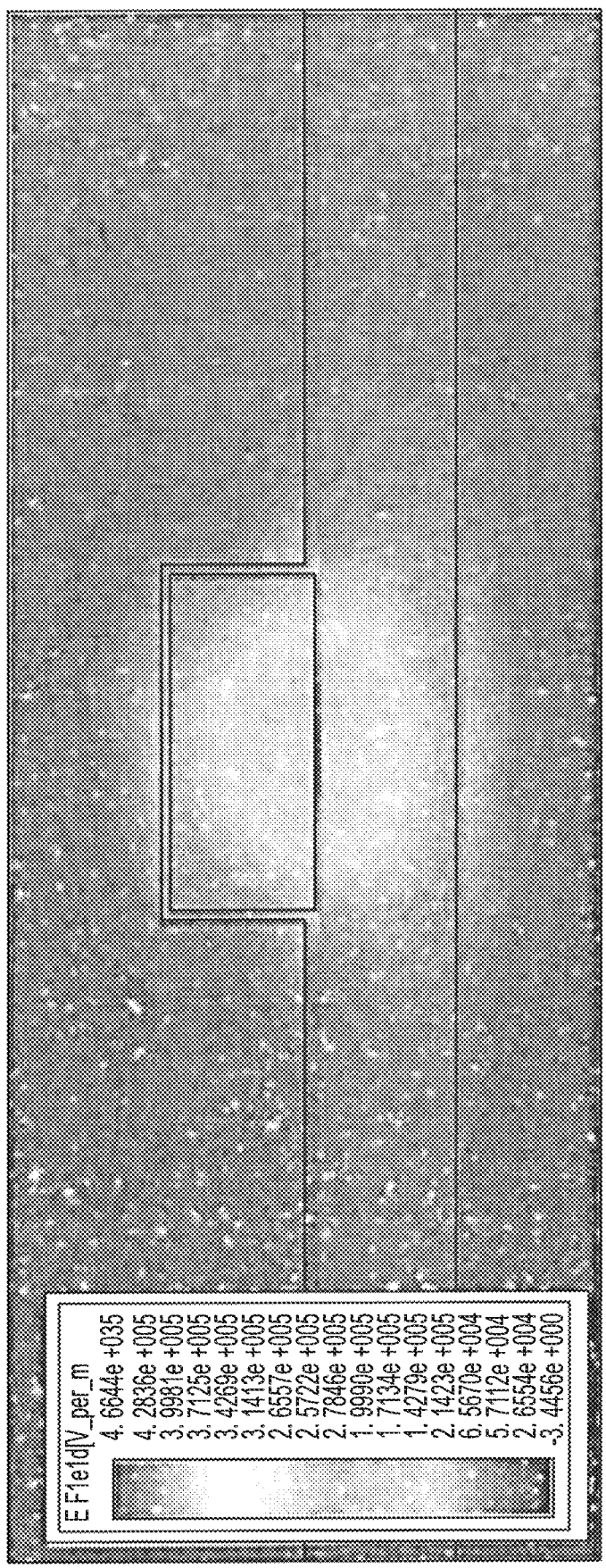
FIG. 14 shows the complex magnitude E-field distribution $(E)^y_{11}$ mode) in the cross-sectional view of DML circuits fabricated according to embodiments of the invention.

FIG. 14 shows the complex magnitude E-field distribution (E$^y_{11}$ mode) in the cross-sectional view of the fabricated DML circuits of FIG. 13B in the x-y plane at 850 GHz. In comparing the complex magnitude E-field distributions of FIG. 1D (for the structure as shown in FIG. 1A) and FIG. 14 (for the fabricated structure as shown by 1220 of FIG. 12B) it can be appreciated that the complex magnitude E-field distribution for these structures are very similar. Therefore, the thickness variation in the handle layer of embodiments of the invention is expected to have little effect on the DML performance.

Figure 15A:
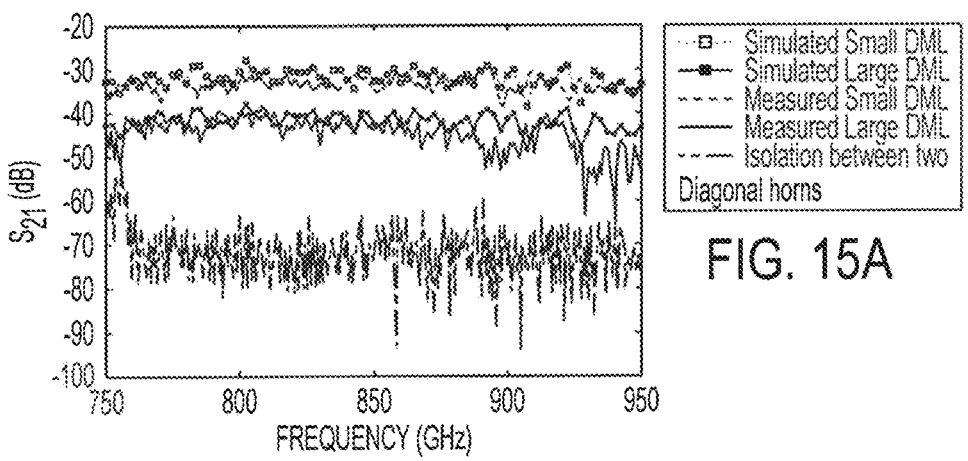
FIG. 15A shows the measured and simulated results of small and large DML samples of embodiments of the invention.

Measured results for the attenuation constant and normalized dispersion of DML circuits fabricated according to embodiments of flow 1200 of FIG. 12A may be obtained using a non-contact measurement system configuration consistent with that of FIG. 6 described above. The measured and simulated results of the small and large DML samples (e.g., the small DML sample configuration of FIG. 9A and the large DML sample of FIG. 9B) are shown in FIG. 15A, The isolation between the diagonal horns of the measurement system is also measured, as shown in FIG. 15A. It can be appreciated from the measured results in FIG. 15A that, except for a very small part at low end of the band (e.g., 750-758 GHz), the isolation of the entire operation frequency band is much larger than the insertion loss of the DML samples.

The attenuation constant and the phase constant of the DML circuits can be calculated from the measured results using the following equations:

$$\begin{cases} \alpha = -\dfrac{\ln(|S_{21}^{small}|) - \ln(|S_{21}^{large}|)}{2(l_{small} - l_{large})} \\ \beta = -\dfrac{\angle S_{21}^{small} - \angle S_{21}^{large}}{2(l_{small} - l_{large})} \end{cases}$$

Figure 15B:
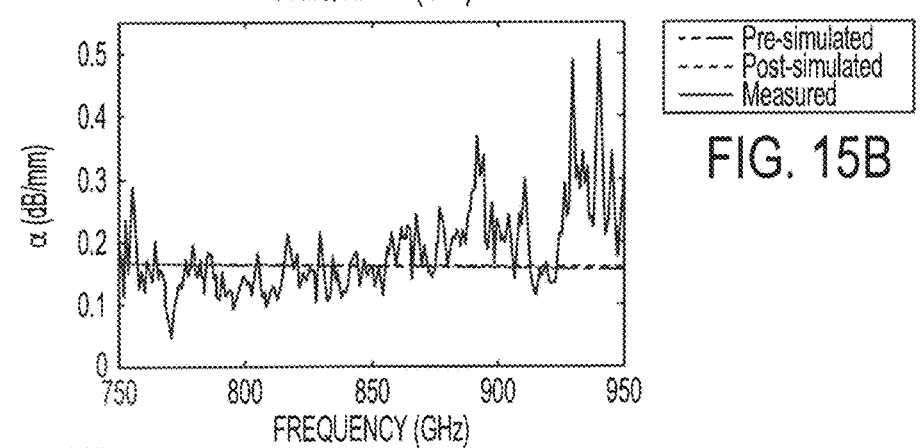
FIG. 15B shows the calculated attenuation constants of DML samples of embodiments of the invention.
Figure 15C:
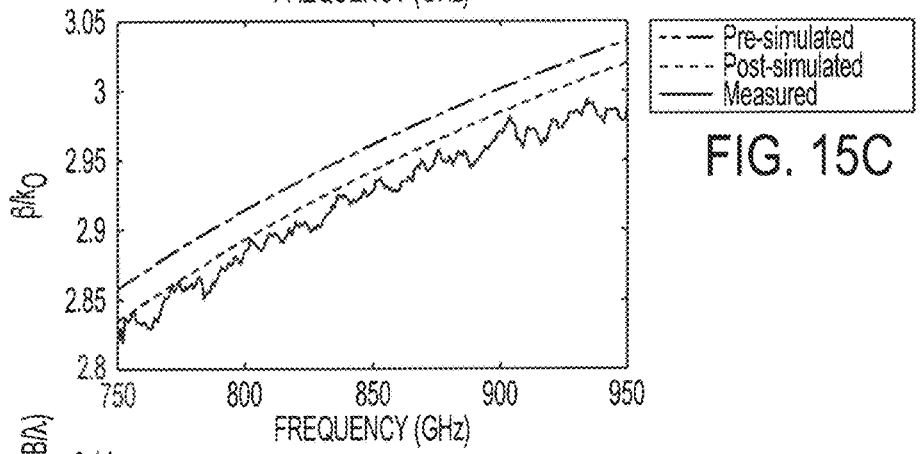
FIG. 15C shows the calculated phase constants of DML samples of embodiments of the invention.

The calculated attenuation and phase constants of the DML samples are shown in FIGS. 15B and 15C, respectively. It should be appreciated that the post-simulated and measured results match well over 750-925 GHz. As discussed above, a high-order E$^y_{21}$ mode may appear in 925-950 GHz, in which case the post-simulated and measured attenuation and phase constant do not match.

The insertion loss per wavelength (IL/λ) can be calculated from the measured results using the following equation:

$$\frac{IL}{\lambda} = \frac{\alpha}{\frac{1}{\lambda}} = \alpha \cdot \lambda = \alpha \cdot \frac{2\pi}{\beta} = \frac{\alpha}{\beta/k_0} \cdot \frac{c}{f}$$

Figure 15D:
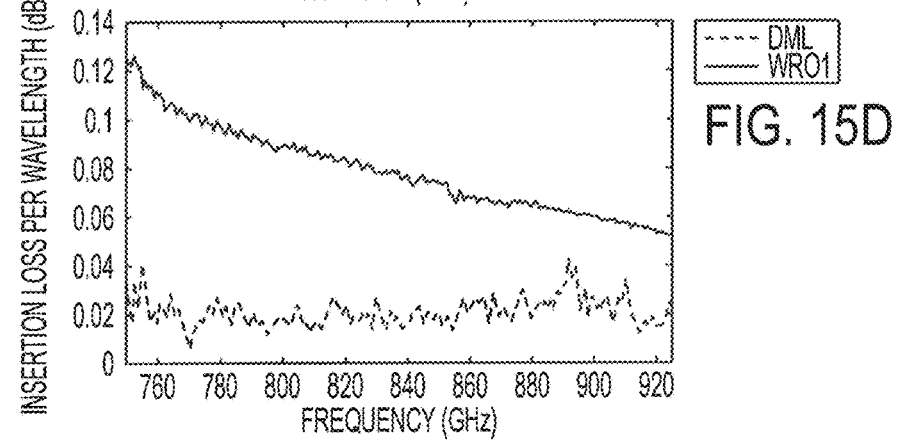
FIG. 15D shows the calculated insertion loss per wavelength of DML samples of embodiments of the invention.

The calculated insertion loss per wavelength of the DML samples is shown in FIG. 15D. As can be appreciated from the data of FIG. 15D, the measured loss per wavelength of the DML ranges from 0.0082 to 0.042 dB/λ over 750-925 GHz, which is much smaller than that of the standard WR01 waveguide (0.079 dB/λ, average value) from the VDI Company over 750-925 GHz.

Measured results for the DML crossover and DML coupler circuits (e.g., the DML crossover circuit of FIG. 9C and the DML coupler circuit of FIG. 9D) may likewise be obtained using a non-contact measurement system configuration consistent with that of FIG. 6 described above. It should be appreciated that, because the return loss of the H-plane DML horn antenna utilized according to embodiments is larger than 12.64 dB, the antenna matches well with the air. When measurement of the multi-port components is conducted using a non-contact measurement system of embodiments herein, the ports that do not point to the diagonal horns match well with the air, Thus n.on-contact measurement systems of embodiments do not need any additional matching loads.

Figure 16A:
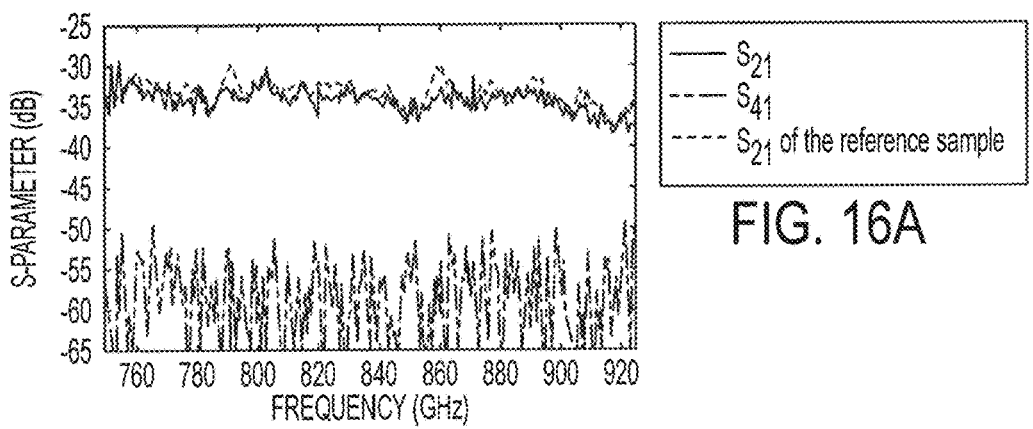
FIG. 16A shows the measured results of a DML crossover circuit fabricated in accordance with embodiments of the invention.
Figure 16B:
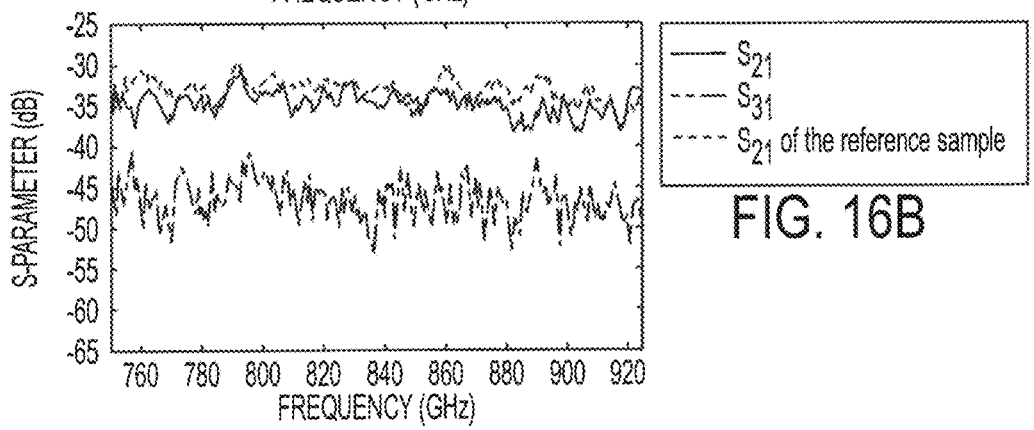
FIG. 16B shows the measured results of a DML coupler circuit fabricated in accordance with embodiments of the invention.

The measured results of the DIVIL crossover and DML coupler fabricated in accordance with the process of flow 1200 of embodiments are shown in FIGS. 16A and 16B, respectively. As can be appreciated from the results shown in FIGS. 16A and 16B, the $S_{21}$ of both the DML crossover circuit and the DML coupler circuit are very similar to that of the reference sample, which supports a conclusion that the insertion loss between the input port and the through port of the crossover and coupler are very small.

Figure 16C:
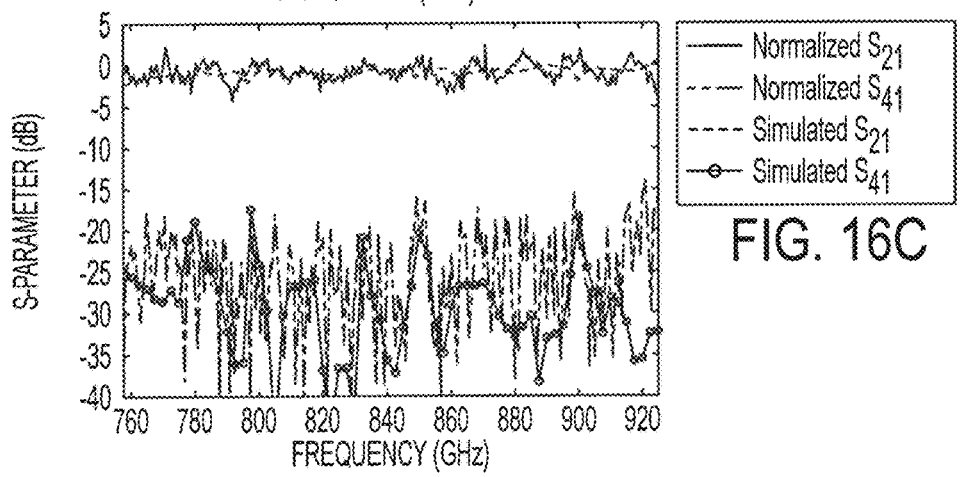
FIG. 16C shows the normalized results of a DML crossover circuit fabricated in accordance with embodiments of the invention.
Figure 16D:
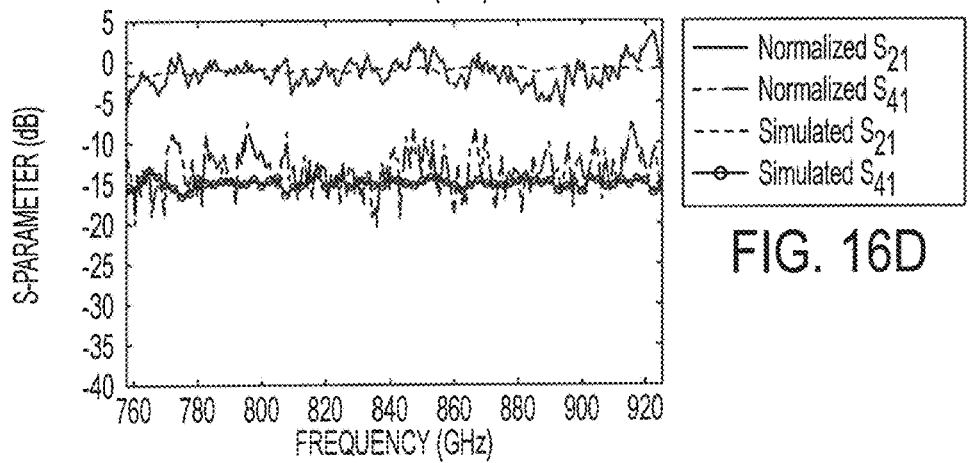
FIG. 16D shows the normalized results of a DML coupler circuit fabricated in accordance with embodiments of the invention.

FIGS. 16C and 16D show the normalized results of the foregoing DML crossover and the DML coupler circuits, respectively. The normalized results of the crossover and coupler can be derived by the following equation:

Normalized $S_{11}$ (dB)=$S_{11}$ (dB)−$S_{21,R}$(dB)

where the $S_{11}$ is the measured result of the crossover or coupler (i=2, 3, 4), and $S_{21,R}$ is the $S_{21}$ of the reference sample. As shown in FIGS. 16C and 16D, the normalized results and the simulated results essentially match. The normalized results show that the exemplary fabricated DML crossover and DML coupler circuits can perform satisfactorily at least over the frequency range 758-925 GHz.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Moreover, the scope of the present application is not intended to be limited to the particular embodiments of the process, machine, manufacture, composition of matter, means, methods and steps described in the specification.

What is claimed is:

1. A silicon on insulator (SOI) based dielectric microstrip line (DML) circuit configured for operation with signals in a range of 750-925 GHz, the DML circuit comprising:
    a silicon dioxide (SiO₂) insulation layer of the SOI providing a middle layer of the DML circuit, wherein the middle SiO2 layer of the DML circuit has a thickness t;
    a high-resistivity silicon (HR—Si) layer providing a top layer of the DML circuit, wherein the top HR—Si layer of the DML circuit has height $h_1$, and wherein a DML structure formed in the top HR—Si layer of the DML circuit has width w; and
    a HR—Si layer providing a bottom layer of the DML, wherein the bottom HR—Si layer of the DML circuit has height $h_2$, and wherein values for parameters $h_1$, $h_2$, and w are selected for a particular value of parameter t and configure the DML circuit for the operation with the signals in the range of 750-925 GHz, wherein the DML circuit comprises a crossover circuit having two mutually perpendicular DML structures in a same plane.

2. The SOI based DML circuit of claim 1, wherein the values for parameters w, $h_1$, and $h_2$ are selected to achieve a smallest attenuation constant of DML for the particular value of parameter t.

3. The SOI based DML circuit of claim 1, wherein the particular value of parameter t is 2 μm, the selected values for parameters w, $h_1$, and $h_2$ are 150 μm, 65 μm, and 65 μm respectively.

4. The SOI based DML circuit of claim 1, wherein the top HR—Si layer of the DML circuit comprises a device layer and the bottom HR—Si layer of the DML circuit comprises a handle layer.

5. The SOI based DML circuit of claim 1, wherein each of the two mutually perpendicular DML structures comprise DMLs with dimensions w=150 μm, $h_1$=65 μm, $h_{2=65}$ μm and t=2 μm.

6. The SOI based DML circuit of claim 1, wherein the crossover circuit provides at least 24 dB isolation between inputs of the mutually perpendicular DML structures.

7. The SOI based DML circuit of claim 6, wherein the isolation between inputs of the mutually perpendicular DML structures is 25.45±5.54 dB.

8. A silicon on insulator (SOI) based dielectric microstrip line (DML) circuit configured for operation with signals in a range of 750-925 GHz, the DML circuit comprising:
    a silicon dioxide (SiO₂) insulation layer of the SOI providing a middle layer of the DML circuit, wherein the middle SiO₂ layer of the DML circuit has a thickness t;
    a high-resistivity silicon (HR—Si) layer providing a top layer of the DML circuit, wherein the top HR—Si layer of the DML circuit has height $h_1$, and wherein a DML structure formed in the top HR—Si layer of the DML circuit has width w; and
    an HR—Si layer providing a bottom layer of the DML, wherein the bottom HR—Si layer of the DML circuit has height $h_2$, and wherein values for parameters $h_1$, $h_2$, and w are selected for a particular value of parameter t and configure the DML circuit for the operation with the signals in the range of 750-925 GHz, wherein the DML circuit comprises a coupler circuit having two DML structures having a 45° intersection angle in a same plane.

9. The SOI based DML circuit of claim 8, wherein each of the intersecting DML structures comprise DMLs with dimensions w=150 μm, $h_1$=65 μm, $h_{2=65}$ μm and t=2 μm.

10. The SOI based DML circuit of claim 8, wherein the coupler circuit provides a coupler factor of at least −10 dB.

11. The SOI based DML circuit of claim 10, wherein the coupler factor is −13.22±3.23 dB.

12. A silicon on insulator (SOI) based dielectric microstrip line (DML) circuit configured for operation with signals in a range of 750-925 GHz, the DML circuit comprising:
    a silicon dioxide (SiO₂) insulation layer of the SOI providing a middle layer of the DML circuit, wherein the middle SiO₂ layer of the DML circuit has a thickness t;
    a high-resistivity silicon (HR—Si) layer providing a top layer of the DML circuit, wherein the top HR—Si layer of the DML circuit has height $h_1$, and wherein a DML structure formed in the top HR—Si layer of the DML circuit has width w; and
    an HR—Si layer providing a bottom layer of the DML, wherein the bottom HR—Si layer of the DML circuit has height $h_2$, and wherein values for parameters $h_1$, $h_2$, and w are selected for a particular value of parameter t and configure the DML circuit for the operation with the signals in the range of 750-925 GHz, wherein the DML circuit comprises a H-plane dielectric horn antenna.

13. The SOI based DML circuit of claim 12, wherein the H-plane dielectric horn antenna configures the DML circuit for operation with a non-contact measurement system.

14. The SOI based DML circuit of claim 12, wherein the H-plane dielectric horn antenna comprises a dielectric extension area of length g, wherein a value of parameter g is selected to match the H-plane dielectric horn antenna to free space.

15. A silicon on insulator (SOT) based dielectric microstrip line (DML) circuit configured for operation with signals in a range of 750-925 GHz, the SOT based DML circuit comprising:
a first layer having height $h_1$ and width w, wherein w is at least 150 μm and $h_1$, is 65 μm or less;
a second layer having thickness t, wherein t is at least 2 μm; and
a third layer having height $h_2$, wherein t is at least 2 μm, w is at least 150 μm, $h_1$, is 65 μm or less, and $h_2$ is 65 μm or less and configure the DML circuit for the operation with the signals in the range of 750-925 GHz, wherein the DML circuit comprises a crossover circuit having two mutually perpendicular DML structures in a same plane or the DML circuit comprises a coupler circuit having two DML structures having a 45° intersection angle in a same plane.

16. The SOI based DML circuit of claim 15, wherein the first and third layers comprise a high-resistivity silicon (HR—Si) layers and the second layer comprises a silicon dioxide ($SiO_2$) insulation layer.

17. The SOI based DML circuit of claim 15, wherein the values for parameters w, $h_1$, and $h_2$ are selected to achieve a smallest attenuation constant of DML for the value of the thickness parameter t.

* * * * *

UNITED STATES PATENT AND TRADEMARK OFFICE
CERTIFICATE OF CORRECTION

PATENT NO. : 10,923,790 B2
APPLICATION NO. : 15/437133
DATED : February 16, 2021
INVENTOR(S) : Quan Wue et al.

It is certified that error appears in the above-identified patent and that said Letters Patent is hereby corrected as shown below:

In the Specification

At Column 1, Line number 26, delete "*THz Technol*" and replace with --*THz Sci. Technol*--.
At Column 1, Line number 27, delete "Elinadjian" and replace with --Elmadjian--.
At Column 1, Line number 37, delete "(SHG)" and replace with --(SIIG)--.
At Column 1, Line number 39, delete "Malekahadi" and replace with --Malekabadi--.
At Column 1, Line number 40, delete "Charlehois" and replace with --Charlebois--.
At Column 2, Line number 18, delete "wavelterahertz" and replace with --wave/terahertz--.
At Column 2, Line number 28, delete "Ranikesh" and replace with --Ranjkesh--.
At Column 2, Line number 30, delete "Part For" and replace with --Part II: For--.
At Column 3, Line number 46, delete "Chin" and replace with --Chiu--.
At Column 3, Line number 61, delete "$SiG_2$" and replace with --$SiO_2$--.
At Column 4, Line number 4, delete "(SHG)" and replace with --(SIIG)--.
At Column 4, Line number 8, delete "M. Bashak. Taeb" and replace with --M. Bashak, A. Taeb--.
At Column 4, Line number 24, delete "invention, in" and replace with --invention. In--.
At Column 5, Line number 46, delete "Horfield" and replace with --H-field--.
At Column 6, Line number 62, delete "4), It" and replace with --4). It--.
At Column 6, Line number 64, delete "k represents" and replace with --$h_1$ represents--.
At Column 7, Line number 6, delete "HESS" and replace with --HFSS--.
At Column 9, Line number 29, delete "(Hz" and replace with --GHz--.
At Column 10, Line number 22, delete "60'" and replace with --60°--.
At Column 10, Line number 38, delete "band 750-780" and replace with --band (e.g., 750-780--.
At Column 12, Line number 48, delete "liontside" and replace with --frontside--.
At Column 13, Line number 21, delete "SIM" and replace --SOI--.
At Column 13, Line number 46, delete "FIG. 13A, From" and replace with --FIG. 13A. From--.
At Column 13, Line number 47, delete "13E" and replace with --13B--.
At Column 13, Line number 54, delete "FIG. 7" and replace with --FIG. 7A--.
At Column 14, Line number 66, delete "n.on-contact" and replace with --non-contact--.
At Column 15, Line number 1, delete "DIVIL" and replace with --DML--.

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,923,790 B2

At Column 15, Line number 15, delete "Normalized $S_{11}$ (dB) = $S_{11}$ (dB)-$S_{21,k}$(dB)" and replace with --Normalized $S_{i1}$ (dB) = $S_{i1}$ (dB)-$S_{21,R}$(dB)--.
At Column 15, Line number 16, delete "$S_{11}$" and replace with --$S_{i1}$--.

In the Claims

At Column 15, Claim number 1, Line number 52, delete "SiO2" and replace with --$SiO_2$--.
At Column 16, Claim number 5, Line number 15, delete "$h_{2=65}μm$" and replace with --$h_2$=65μm--.
At Column 16, Claim number 9, Line number 46, delete "$h_{2=65}μm$" and replace with --$h_2$=65μm--.
At Column 17, Claim number 15, Line number 12, delete "(SOT)" and replace with --(SOI)--.
At Column 17, Claim number 15, Line number 14, delete "(SOT)" and replace with --(SOI)--.